(12) United States Patent
Yamaguchi

(10) Patent No.: US 8,073,028 B2
(45) Date of Patent: Dec. 6, 2011

(54) LIGHT EMITTING APPARATUS, OPTICAL SCANNING APPARATUS, AND IMAGE FORMING APPARATUS

(75) Inventor: Takayuki Yamaguchi, Miyagi (JP)

(73) Assignee: Ricoh Company, Ltd., Tokyo (JP)

( * ) Notice: Subject to any disclaimer, the term of this patent is extended or adjusted under 35 U.S.C. 154(b) by 104 days.

(21) Appl. No.: 12/474,381

(22) Filed: May 29, 2009

(65) Prior Publication Data

US 2009/0296762 A1    Dec. 3, 2009

(30) Foreign Application Priority Data

May 29, 2008 (JP) ................................. 2008-141603
Apr. 13, 2009 (JP) ................................. 2009-097118

(51) Int. Cl.
*H01S 3/04* (2006.01)
*H01S 3/10* (2006.01)
*G02B 26/08* (2006.01)
*G02B 26/10* (2006.01)
*G02B 26/12* (2006.01)

(52) U.S. Cl. ............ 372/34; 372/36; 372/24; 359/197.1
(58) Field of Classification Search .................. 372/34, 372/36, 24; 359/197.1
See application file for complete search history.

(56) References Cited

U.S. PATENT DOCUMENTS

| | | | |
|---|---|---|---|
| 6,483,862 B1 * | 11/2002 | Aronson et al. | 372/50.21 |
| 2005/0093962 A1 * | 5/2005 | Miyatake et al. | 347/235 |
| 2007/0085101 A1 * | 4/2007 | Kim | 257/98 |

FOREIGN PATENT DOCUMENTS

| | | |
|---|---|---|
| CN | 281954 Y | 9/2006 |
| JP | 2001-208672 | 8/2001 |
| JP | 2003-317301 | 11/2003 |
| JP | 2003-322603 | 11/2003 |
| JP | 2004-5905 | 1/2004 |
| JP | 2004-39041 | 2/2004 |
| JP | 2004-228549 | 8/2004 |
| JP | 2005-86054 | 3/2005 |
| JP | 2005-99069 | 4/2005 |
| JP | 2005-106882 | 4/2005 |
| JP | 2007-17808 | 1/2007 |
| JP | 2007-19348 | 1/2007 |
| WO | WO2007/049938 A1 | 5/2007 |
| WO | WO 2007049938 A1 * | 5/2007 |

OTHER PUBLICATIONS

Apr. 13, 2010 Chinese official action (and English translation thereof) in connection with counterpart Chinese patent application No. 2009102028301.

* cited by examiner

*Primary Examiner* — Patrick Stafford
(74) *Attorney, Agent, or Firm* — Cooper & Dunham LLP

(57) ABSTRACT

A light emitting apparatus includes a surface emitting laser and a ceramic package. The surface emitting laser has a common electrode on the back surface thereof and is mounted on the ceramic package via the common electrode. The common electrode of the surface emitting laser is electrically connected to a mount portion of the ceramic package. The mount portion is electrically connected to a back-surface electrode on the back surface of the ceramic package. The mount portion is also thermally connected to a back-surface heat-dissipating electrode on the back surface of the ceramic package via a penetrating electrode that penetrates the ceramic package. The surface emitting laser is spaced apart from the penetrating electrode in order to prevent inclination in light-emitted direction. The back-surface heat-dissipating electrode prevents destruction of a soldered portion when the light emitting apparatus is mounted on a substrate by soldering.

10 Claims, 17 Drawing Sheets

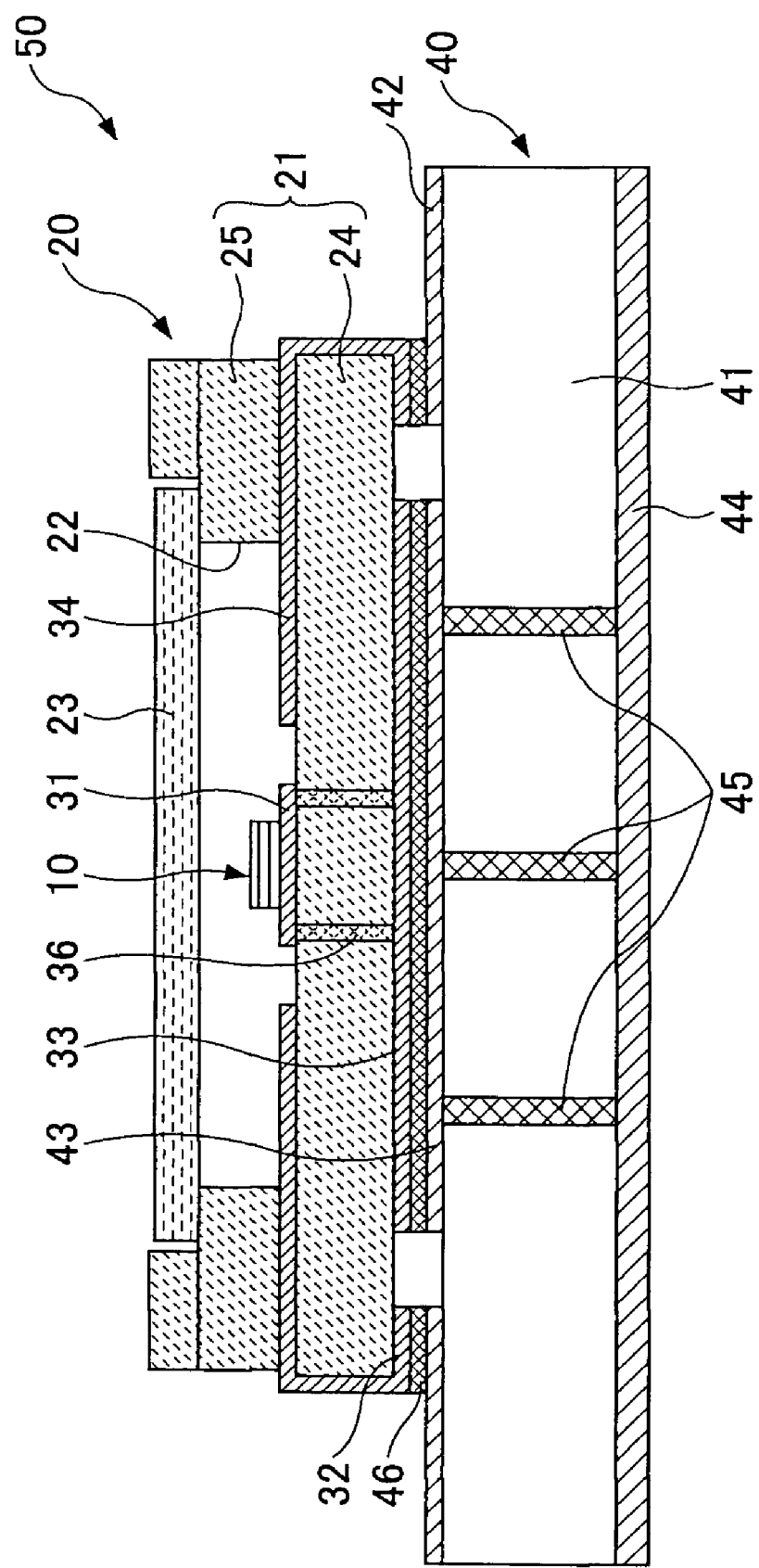

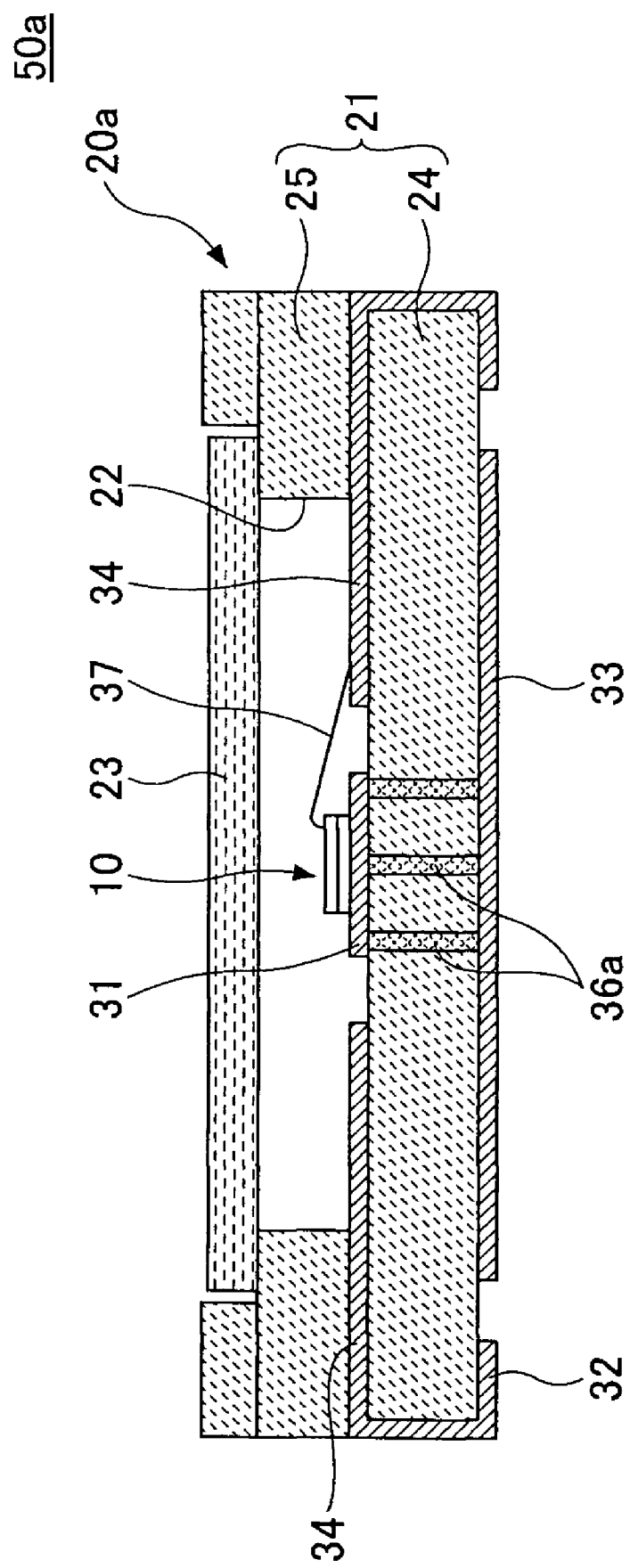

LIGHT EMITTING APPARATUS, OPTICAL SCANNING APPARATUS, AND IMAGE FORMING APPARATUS

BACKGROUND

1. Technical Field

This disclosure generally relates to light emitting apparatuses, optical scanning apparatuses, and image forming apparatuses. In particular, the present invention relates to a light emitting apparatus, an optical scanning apparatus, and an image forming apparatus having improved heat-dissipating characteristics.

2. Description of the Related Art

A vertical-cavity surface-emitting laser (VCSEL; hereafter referred to as a surface emitting laser) emits laser light in a direction perpendicular to a semiconductor substrate. Compared with the edge-emitting semiconductor laser that emits laser light in a direction parallel to the semiconductor substrate, the surface emitting laser costs less, consumes less power, performs better, and is smaller in size. Thus, the surface emitting laser is gaining increasing attention in recent years as a light source for optical communications and or for the writing in printers, for example.

Particularly, the use of the surface emitting laser enables a 2-dimensional array structure of semiconductor laser elements, which has not been possible with the edge-emitting semiconductor laser. The 2-dimensional array structure of the surface emitting laser elements allows a high-density integration of light sources, thereby enabling an oscillation of high-output laser light.

When the surface emitting laser elements are arrayed 2-dimensionally, a large amount of heat is generated from a small area, thus requiring sufficient heat dissipation. If heat dissipation is insufficient in the surface emitting laser, the temperature of each surface emitting laser element increases. As a result, it becomes harder for induced emission of carriers to occur in the individual surface emitting laser elements, leading to a decrease in emission efficiency. Oscillation wavelengths may also fluctuate, or the lifetime of the element itself may become shorter.

Thus, in order to prevent the temperature increase in the surface emitting laser elements, not only are the characteristics of the surface emitting laser per se important, but also the package of the surface emitting laser should have high durability and superior heat-dissipating characteristics.

In this respect, the ceramic package offers superior durability, heat-dissipating characteristics, and heat and corrosion resistance over the organic package made of organic material such as resin. Thus, the ceramic package is suitable for mounting the surface emitting laser elements.

Japanese Laid-Open Patent Application No. 2004-228549 discloses a ceramic package for the mounting of the light-emitting elements, such as conventional surface emitting laser elements. The ceramic package includes a cavity (hereafter referred to as an "opening portion") at a central portion on an upper surface of the package, in which the light-emitting elements is located. At a substantially central portion of a bottom surface in the opening portion, a conductor layer is formed by metallization to provide a mount portion on which the light-emitting elements are bonded. Areas around the conductor layer as the mount portion are metalized (in a metal wire forming step) to form a conductor layer for wire bonding.

Such a ceramic package may be manufactured by a ceramic green sheet laminating method which may involve the following steps. First, green sheets having punched-out portions are laminated so that the opening portion can be formed, thereby obtaining a laminated body. The bottom surface in the opening portion of the laminated body is coated with a conductive paste for forming a metalized layer (metal wiring layer) by the screen printing method, for example. The green sheet thus coated with the conductive paste is then calcined at high temperature, obtaining a ceramic sintered body having a metalized layer.

When a light emitting apparatus is constructed by mounting the surface emitting laser in the above ceramic package, there have been the following problems. Namely, when the surface emitting laser is mounted in the mount portion of the above-described ceramic package, heat dissipation is solely dependent on the ceramic material with the superior heat-dissipating characteristics compared with the organic package using a resin, and on a common electrode in the mount portion. No other measures are taken to actively improve heat-dissipating characteristics, resulting in insufficient heat dissipation.

The aforementioned common electrode is a single electrode combining the lower electrodes of the surface emitting laser in which plural surface emitting laser elements are arranged. When the surface emitting laser is mounted in the ceramic package, the common electrode is typically disposed on the bottom side and electrically and thermally connected to a ground terminal of the ceramic package by soldering or using an electrically conductive adhesive. Thus, in this case, the common electrode of the surface emitting laser is electrically connected to ground via the ground terminal of the ceramic package and ground wiring. However, the ground terminal and ground wiring have limited cross-sectional areas which limit the amount of heat generated by the surface emitting laser that can be dissipated via the ground terminal and ground wiring.

In addition, when the ceramic package with the surface emitting laser is mounted on a printed board, as the temperature rises and falls repeatedly corresponding to the turning on and off of light emission, a repetitive stress is produced by the difference in the coefficients of thermal expansion between the ceramic package and the printed board. The stress is concentrated at around the terminal electrodes between the printed board and the ceramic package that are soldered, resulting in a destruction of the soldered portion.

Furthermore, when the surface emitting laser is used as a light source for optical communications or for the writing in a printer, the light-emitted direction may vary, necessitating individual adjustments when combined with optical components, thus lowering productivity.

In the ceramic package formed by the aforementioned green sheet laminating method, the back surface, the mount surface, and the upper surface are formed by the green sheet surfaces, where parallelism can be ensured. The surface emitting laser has the feature that it emits light in a direction perpendicular to the semiconductor substrate surface. Thus, when the surface emitting laser is mounted on the mount portion provided on the bottom surface in the opening portion of the ceramic package, the emitted light is substantially perpendicular to the bottom surface or the upper surface of the ceramic package.

However, when a penetrating electrode is formed as a heat-dissipating electrode penetrating the ceramic package from the bottom surface in the opening portion to the back surface thereof, areas around the penetrating electrode are raised by the process of forming a via hole in the green sheet, thus producing surface irregularities. If the surface emitting laser is mounted on such a raised portion, the surface emitting laser is inclined, so that the direction of emission of light is also inclined with respect to the normal to the upper surface of the ceramic package.

SUMMARY OF THE INVENTION

In an aspect of this disclosure, there are provided a light emitting apparatus, an optical scanning apparatus, and an image forming apparatus having excellent heat-dissipating characteristics, in which destruction of a soldered portion by a difference in coefficient of thermal expansion is prevented and no inclination in light-emitted direction is caused.

According to an aspect, a light emitting apparatus includes a surface emitting laser having plural individual electrodes disposed on an upper surface thereof and a common electrode disposed on a lower surface thereof; and a ceramic package having an opening portion and a metal mount portion disposed on a bottom surface of the opening portion for mounting the surface emitting laser.

The common electrode of the surface emitting laser is electrically connected with the mount portion. The ceramic package includes a first back-surface electrode disposed at an edge on a back surface of the ceramic package, and a back-surface heat-dissipating electrode disposed at a center portion of the back surface of the ceramic package. The mount portion, to which the common electrode is electrically connected, is electrically connected to a second back-surface electrode disposed at the edge on the back surface of the ceramic package via a common electrode lead. The second back-surface electrode is connected to ground.

The mount portion is also thermally connected to the back-surface heat-dissipating electrode via a penetrating electrode that penetrates the ceramic package between the bottom surface of the opening portion and the back surface of the ceramic package.

According to another aspect of this disclosure, an optical scanning apparatus for scanning a scanned surface with light includes the above light emitting apparatus; a deflector configured to deflect light emitted by the emitting apparatus; and a scanning optical system configured to collect the light deflected by the deflector on the scanned surface.

According to yet another aspect, an image forming apparatus includes the above optical scanning apparatus, and an image carrier having a scanned surface. The optical scanning apparatus scans the scanned surface of the image carrier with light having information about an image in order to form the image on the scanned surface of the image carrier,

BRIEF DESCRIPTION OF THE DRAWINGS

The aforementioned and other aspects, features and advantages will be apparent to those skilled in the art from the following detailed description of the, when read in conjunction with the accompanying drawings in which:

FIG. 7 is a cross section of an assembly of the light emitting apparatus according to the first embodiment mounted on a printed board;

FIG. 9 is a cross section of the light emitting apparatus according to the first variation of the first embodiment, taken along line B-B of FIG. 8A;

DETAILED DESCRIPTION OF THE PREFERRED EMBODIMENTS

Figure 1:
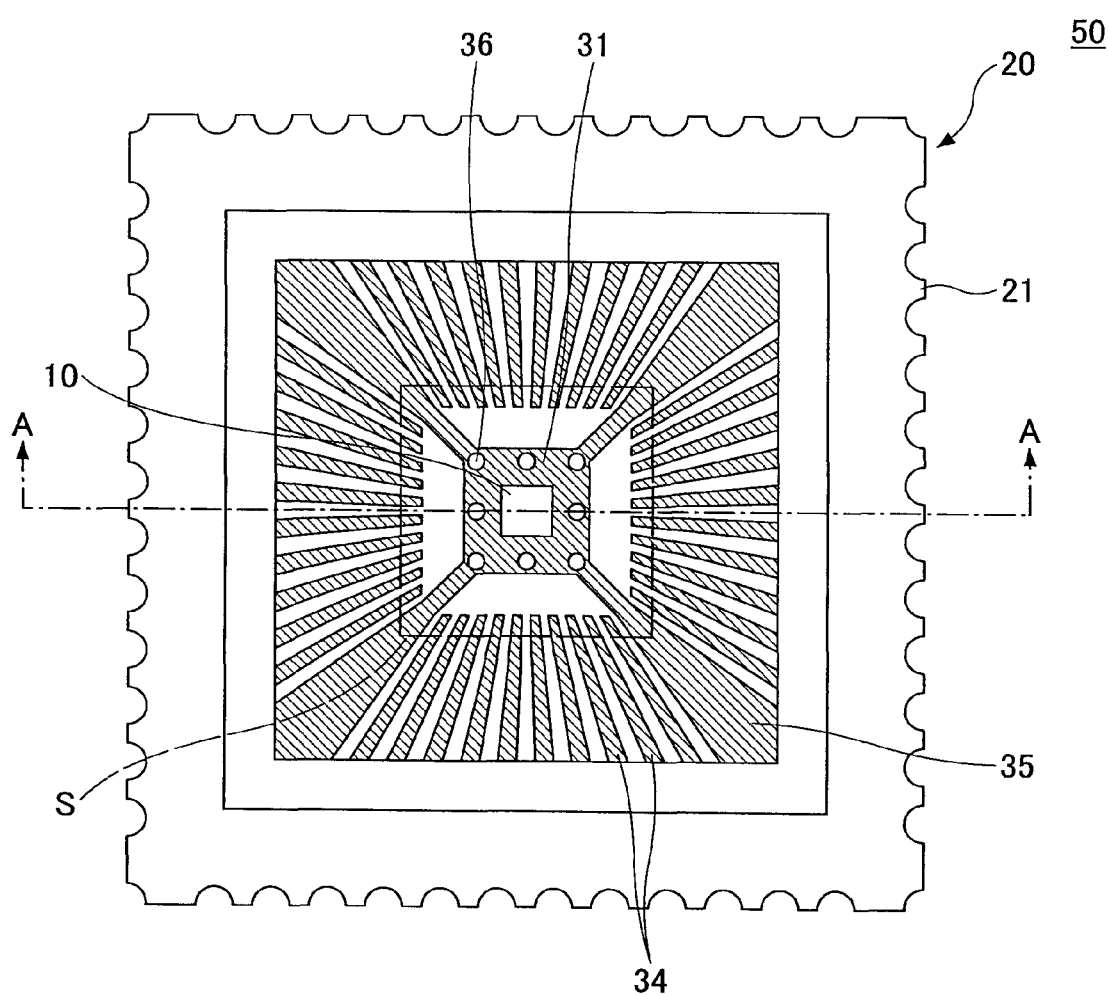
FIG. 1 is a plan view of a light emitting apparatus according to a first embodiment of the present invention.

Preferred embodiments are described with reference to the drawings, wherein like reference numerals designate identical or corresponding parts throughout the several views.

First Embodiment

Figure 2:
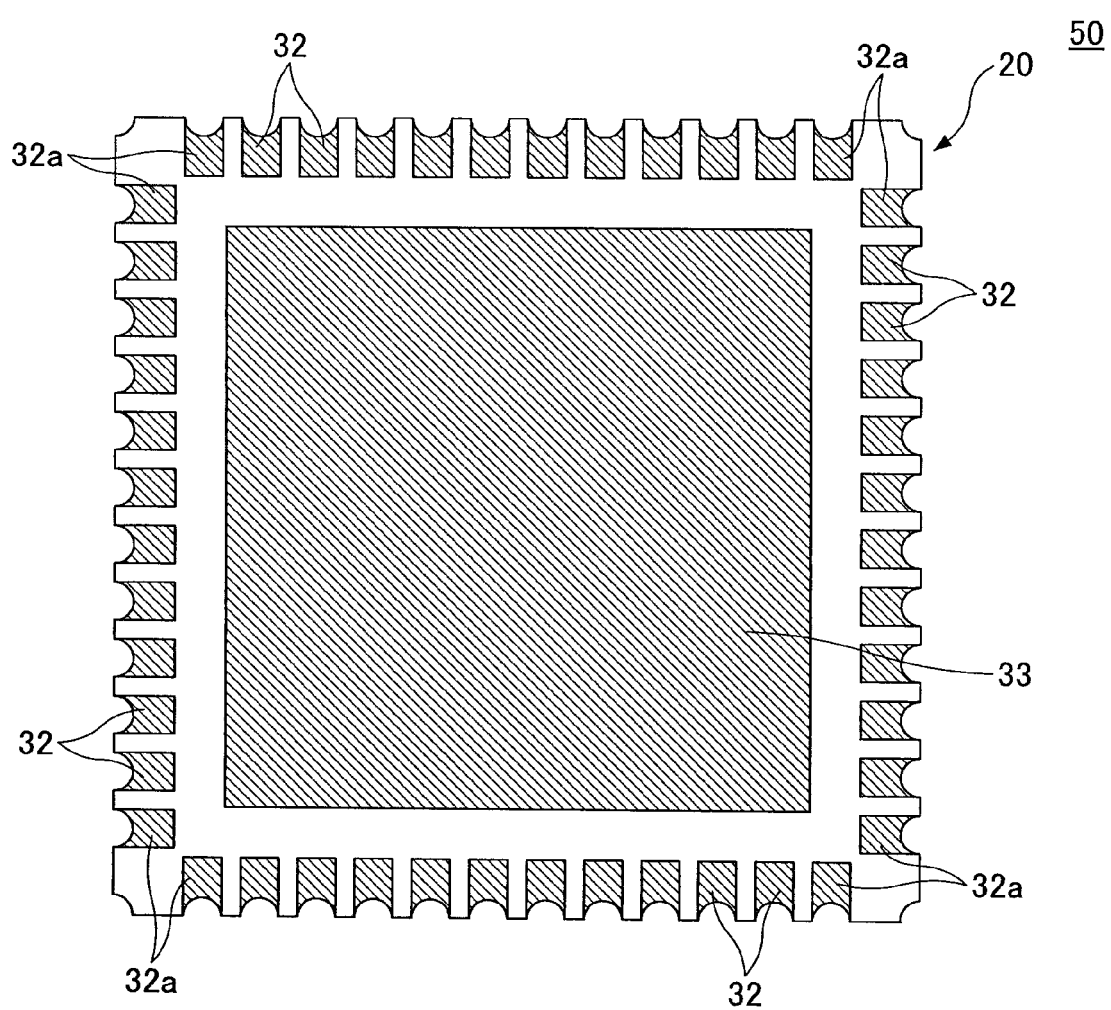
FIG. 2 schematically shows a back surface of the light emitting apparatus according to the first embodiment.
Figure 3:
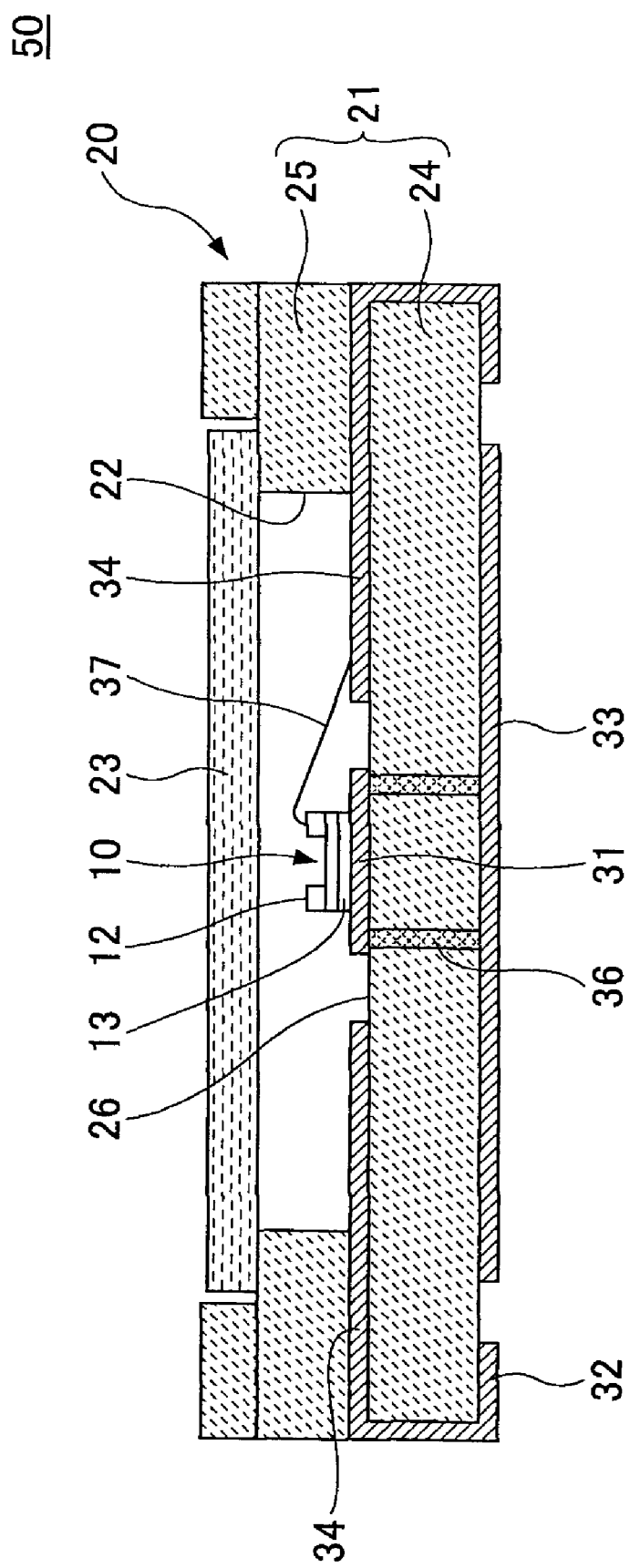
FIG. 3 is a cross section of the light emitting apparatus according to the first embodiment, taken along line A-A of FIG. 1.
Figure 4:
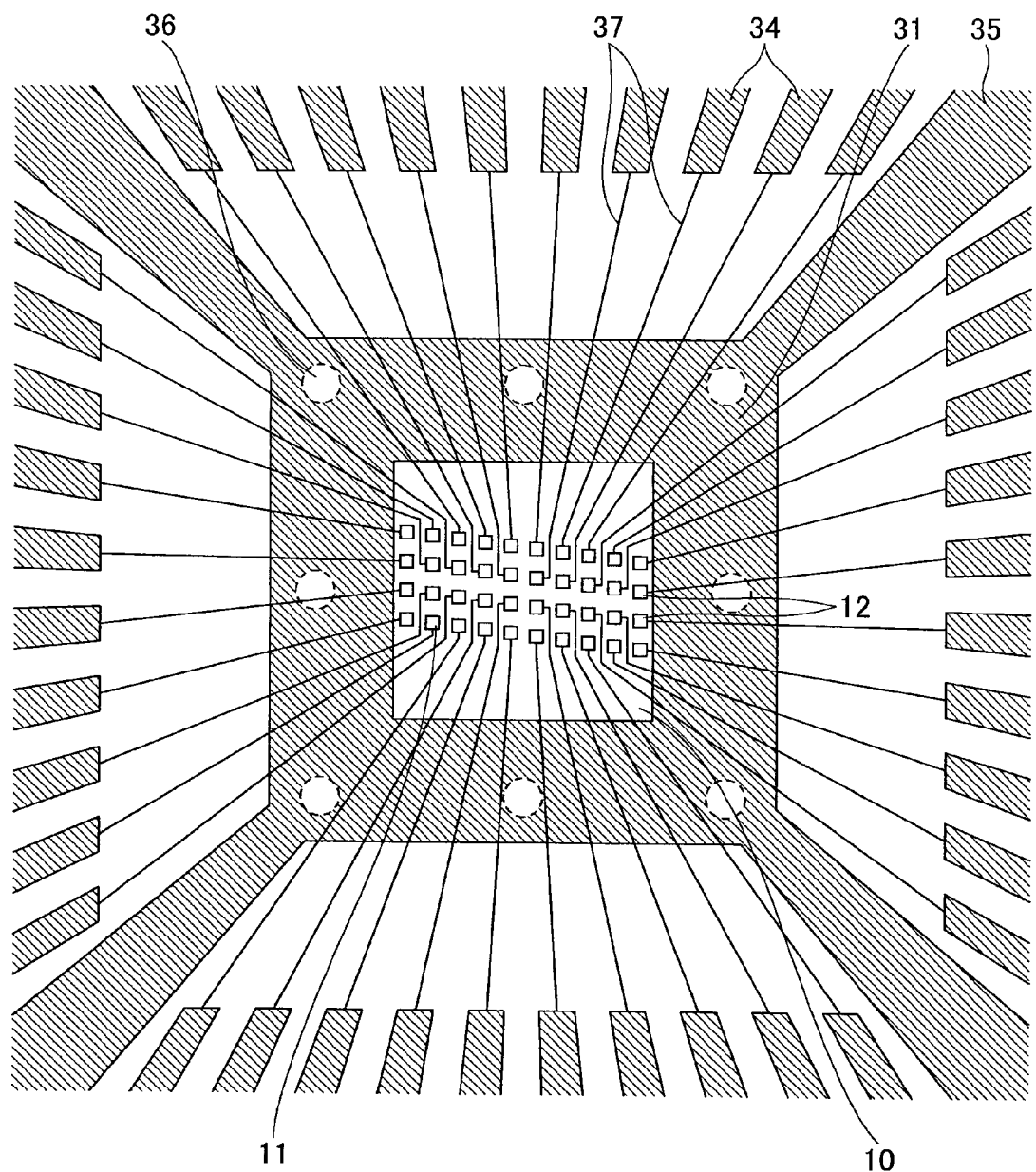
FIG. 4 is an enlarged plan view of an area S encircled by a broken line in FIG. 1.

With reference to FIGS. 1 to 4, a light emitting apparatus 50 according to a first embodiment of the present invention is described. FIG. 1 is a schematic plan view of the light emitting apparatus 50. FIG. 2 shows a back surface of the light emitting apparatus 50. FIG. 3 shows a cross section taken along line A-A of FIG. 1. FIG. 4 is a plan view of the light emitting apparatus 50, showing an enlarged view of a region S enclosed by broken lines in FIG. 1.

With reference to FIGS. 1 to 3, the light emitting apparatus 50 includes a surface emitting laser array 10, and a ceramic package 20 for mounting the surface emitting laser array 10. The surface emitting laser array 10 includes plural surface emitting laser elements 11, plural individual electrodes 12 corresponding to the plural surface emitting laser elements 11, and a common electrode 13. The ceramic package 20 includes a package substrate 21; a mount portion 31; back-surface electrodes 32; a back-surface heat-dissipating electrode 33; individual electrode leads 34; common electrode leads 35; and penetrating electrodes 36. The surface emitting laser array 10 is mounted on the mount portion 31 and is electrically and thermally connected to the mount portion 31 via an electrically conductive adhesive or by soldering.

As shown in FIG. 4, the surface emitting laser elements 11 are 2-dimensionally arranged on an integral semiconductor substrate. As will be described later with reference to the second embodiment, the light emitting apparatus 50 may function as a light source unit 110 in an optical scanning apparatus 900.

In accordance with the present embodiment, the surface emitting laser elements 11 may be arranged in an array of 4 rows×10 columns, as shown in FIG. 4. The row direction and the column direction correspond to a main scan direction and a sub-scan direction, respectively, on a scanned surface when the surface emitting laser array 10 is incorporated in the optical scanning apparatus 900 according to the second embodiment. The surface emitting laser elements 11 are staggered in the sub-scan direction in a stepwise manner. The surface emitting laser array 10 may have a chip size of 1.2 mm square. Each of the surface emitting laser elements 11 may have an element size of 25 μm square.

Referring to FIG. 3, the package substrate 21 includes a substrate bottom portion 24 and a substrate raised portion 25 integrally formed on an upper peripheral surface of the substrate bottom portion 24. The space above the substrate bottom portion 24 surrounded by the substrate raised portion 25 provides an opening portion 22 of the package substrate 21. A stepped portion is formed in the substrate raised portion 25 allowing a package lid 23 to rest in a locked manner, thus closing the opening portion 22.

An upper surface of the substrate bottom portion 24 surrounded by the substrate raised portion 25 and defining the opening portion 22 is referred to as a bottom surface 26 of the opening portion 22.

The package substrate 21 is made of a material having higher heat conductivity than organic material, such as an alumina sintered body or an aluminum nitride sintered body.

The package lid 23 protects the surface emitting laser array 10 as well as it provides a window for letting the laser light from the surface emitting laser array 10 be emitted upward out of the ceramic package 20. The package lid 23 only needs to be transparent to the laser light emitted by the surface emitting laser array 10 and is not particularly limited otherwise. The package lid 23 may comprise a substrate of a transparent inorganic material, such as optics glass, silica glass, or alumina single crystal (so-called "sapphire glass").

The mount portion 31 is formed by metalizing a central portion of the bottom surface 26. The mount portion 31 functions as an electrode electrically connected with the common electrode 13 on the back surface of the surface emitting laser array 10, as well as providing a base for the surface emitting laser array 10. The mount portion 31 has a size in plan view such that it covers the entire back surface of the surface emitting laser array 10. The size of the mount portion 31 in plan view may be 2.4 mm square.

Referring to FIG. 2, a plurality of the back-surface electrodes 32 may be disposed at predetermined intervals at the peripheral edges on the back surface of the ceramic package 20. The back-surface electrodes 32 may be used for mounting the light emitting apparatus 50 on an external substrate or for connecting to external connection wires. The number of the back-surface electrodes 32 is not particularly limited. For example, twelve back-surface electrodes 32 are provided at predetermined intervals per side of the square package substrate 21. Of the 12, the inner ten may be used for connection with the corresponding individual electrodes 12. In this case, a total of forty individual electrodes 12 are connected to the back-surface electrodes 32 all around the sides.

In this case, two of the back-surface electrodes at either end of each side of the square that are designated 32a, or a total of eight back-surface electrodes 32a, are connected to the common electrode 13 instead of the individual electrodes 12 of the surface emitting laser element 11.

As shown in FIG. 2, the back-surface heat-dissipating electrode 33 extends substantially throughout the back surface of the ceramic package 20. The back-surface heat-dissipating electrode 33 is thermally connected to the mount portion 31 via the penetrating electrodes 36, as will be described in detail later, in order to dissipate the heat generated by the light emitting apparatus 50. When the entire back-surface heat-dissipating electrode 33 is connected to terminal electrodes for dissipating heat from a printed board, the back-surface heat-dissipating electrode 33 also functions to prevent the destruction or peeling of soldering between the back-surface electrodes 32 of the ceramic package 20 and the terminal electrodes of the printed board. Such destruction or peeling of the soldered portion is caused by the difference in the coefficients of thermal expansion between the ceramic package 20 and the printed board as the temperature rises and falls corresponding to the turning on and off of light emission.

The back-surface heat-dissipating electrode 33 is spaced apart from the back-surface electrodes 32 at the edges of the back surface of the ceramic package 20 with a predetermined distance. Thus, the back-surface heat-dissipating electrode 33 is similar in shape to the ceramic package 20.

As shown in FIGS. 1 and 3, the individual electrode leads 34 are disposed on the upper surface of the substrate bottom portion 24 and are spaced apart from the mount portion 31. Specifically, each of the individual electrode leads 34 extends from a point a predetermined distance away from the external periphery of the mount portion 31, towards the edges of the ceramic package 20 without intersecting each other. The individual electrode leads 34 further extend until they reach the sides of the package substrate 21, and are then turned around the lower edges of the package substrate 21, finally reaching the back-surface electrodes 32 at the edges on the back surface of the package substrate 21.

The individual electrode leads 34 connect the individual electrodes 12 of the plural surface emitting laser elements 11 to the plural back-surface electrodes 32 at the edges on the back surface of the package substrate 21 on a one-to-one relationship. Each of the individual electrodes 12 is wire-bonded to the corresponding electrode lead 34 via a wire 37. The pattern shape of the individual electrode leads 34 in plan view is not particularly limited. The radial pattern shown in FIGS. 1 to 4 is just an example, where the individual electrode leads 34 radially extend from the center of the package substrate toward the edges in order to reduce the wiring distance.

As shown in FIG. 1, the common electrode leads 35 are disposed on the substrate bottom portion 24 and electrically connected to the mount portion 31. Specifically, the common electrode leads 35 are drawn out from around the apex of each of the four corners of the substantially square mount portion 31. The common electrode leads 35 further extend therefrom without intersecting any of the individual electrode leads 34, until they are drawn out onto the sides of the package substrate 21. The common electrode leads 35 are then turned around the lower edges of the sides of the package substrate 21, and eventually connected to the back-surface electrodes 32 at the edges on the back surface of the package substrate 21.

The common electrode leads 35 connect the common electrode 13 of the surface emitting laser element 11 formed on the back surface of the surface emitting laser array 10 to the total of eight back-surface electrodes 32a at the ends of each side of the back surface of the package substrate 21. The pattern shape of the common electrode leads 35 in plan view is not particularly limited. The radial pattern shown in FIGS.

1 to 4 is merely an example, in which the common electrode leads 35 extend from the center of the package substrate towards the edges radially in order to reduce the wiring distance.

The penetrating electrodes 36 penetrate the substrate bottom portion 24 between the bottom surface 26 of the opening portion and the back surface of the ceramic package 20. The penetrating electrodes 36 thermally connect the mount portion 31 to the back-surface heat-dissipating electrode 33. The penetrating electrodes 36 are disposed below areas of the mount portion 31 where the surface emitting laser array 10 is not mounted. Specifically, as shown in FIG. 1, the penetrating electrodes 36 are disposed such that, in plan view, they surround the surface emitting laser array 10 mounted at the center of the mount portion 31. In accordance with the present embodiment, a total of eight penetrating electrodes 36 may be formed as shown in FIG. 1.

As described above, the common electrode 13 of the surface emitting laser array 10 is initially electrically and thermally connected to the mount portion 31. The mount portion 31 is electrically and thermally connected to the back-surface heat-dissipating electrode 33 via the penetrating electrodes 36. Thus, the heat generated by the surface emitting laser array 10 is transmitted via the mount portion 31 and the penetrating electrodes 36 to the back-surface heat-dissipating electrode 33.

Without the penetrating electrodes 36 and the back-surface heat-dissipating electrode 33, the heat generated by the surface emitting laser array 10 would be transmitted via the mount portion 31 and the common electrode leads 35 to the back-surface electrodes 32a connected to ground. In this case, the heat-transmitting path has a smaller cross-sectional area, and the heat cannot be efficiently dissipated.

Thus, the penetrating electrodes 36 and the back-surface heat-dissipating electrode 33 allow the heat generated by the surface emitting laser array 10 to be transmitted via the mount portion 31 and the penetrating electrodes 36 efficiently. Consequently, the temperature increase of the surface emitting laser array 10 can be controlled and degrading of the surface emitting laser array 10 can be prevented, thus extending the lifetime of the surface emitting laser array 10.

Hereafter, a method of manufacturing the ceramic package including the metallization of the package substrate 21 is described.

The package substrate 21 is not particularly limited and may comprise a known ceramic package. Examples of the material for the package substrate include HTCC (High Temperature Co-fired Ceramic), which contains alumina as a principal component; LTCC (Low Temperature Co-fired Ceramic), which is a composite material of glass and alumina; and an AlN package which contains aluminum nitride as a principal component.

In the case of the HTCC package, a material powder may be made by mixing several wt. % of each of the powders of manganese oxide, silica, magnesia, and calcia as sintering aids with an alumina powder. In the case of the LTCC package, a mixture powder containing glass and ceramic powder in dispersed form may be used. In the case of the AlN package, a material powder may be made by mixing several wt. % of each of powders of $Y_2O_3$ and CaO as sintering aid with an AlN powder.

An organic binder and a solvent known in the art are added to the material powder and kneaded to prepare a slurry. Thereafter, a green sheet is manufactured from the slurry by the known doctor blade method. Alternatively, an organic binder may be added to the mixture powder and a green sheet may be manufactured by press forming or rolling as well known in the art.

In order to form the penetrating electrode in the package substrate, after the green sheet is manufactured, a via hole with a diameter of 50 to 250 μm is formed using a micro-drill or by punching using a mold. In the present embodiment, via holes with the diameter of 200 μm may be formed.

The via holes thus provided in the green sheet are then filled with a conductive paste, and the conductive paste is applied by screen printing or gravure printing, for example, so that a desired wiring pattern can be formed.

The conductive paste may include tungsten or molybdenum as a conducting component. In order to achieve better adhesion between the alumina sintered body and the conductor layer, 10 wt. % of alumina powder may be added to the conductive paste. In the case of the LTCC package, silver or copper may be used.

Thereafter, the green sheet printed with the conductive paste is laminated and pressure-bonded while positioned properly, thereby obtaining a laminated body. The laminated body is then calcined to render the green sheet into a ceramic form, thus obtaining a package substrate. In the case of a HTCC package, calcination may be conducted at temperature of about 1600° C. In the case of a LTCC package, the calcination temperature may be about 850° C. In the case of an AlN package, the calcination temperature may be about 1800° C.

In an example, the surface of the conductor layer formed on the package substrate was then nickel-plated, and the surface was further Au-plated for metallization. The mount portion 31 of the thus prepared package substrate 21 was then coated with an electrically conductive paste, and the surface emitting laser array 10 was mounted on the mount portion 31. Curing was then performed (using an oven at temperature of 100° C. to 200° C. for several tens of minutes), whereby the surface emitting laser array 10 was attached to the mount portion 31. Thereafter, the individual electrode leads 34 on the bottom surface of the opening portion 22 were electrically connected by wire bonding to the individual electrodes 12 of the surface emitting laser array 10 via the wires 37.

Finally, the opening portion 22 is closed with the package lid 23 which may be made of a transparent substrate. The package lid 23 may then be sealed with a resin. Thus, a light emitting apparatus is obtained where the surface emitting laser array 10 is mounted in the ceramic package 20.

Figure 5:
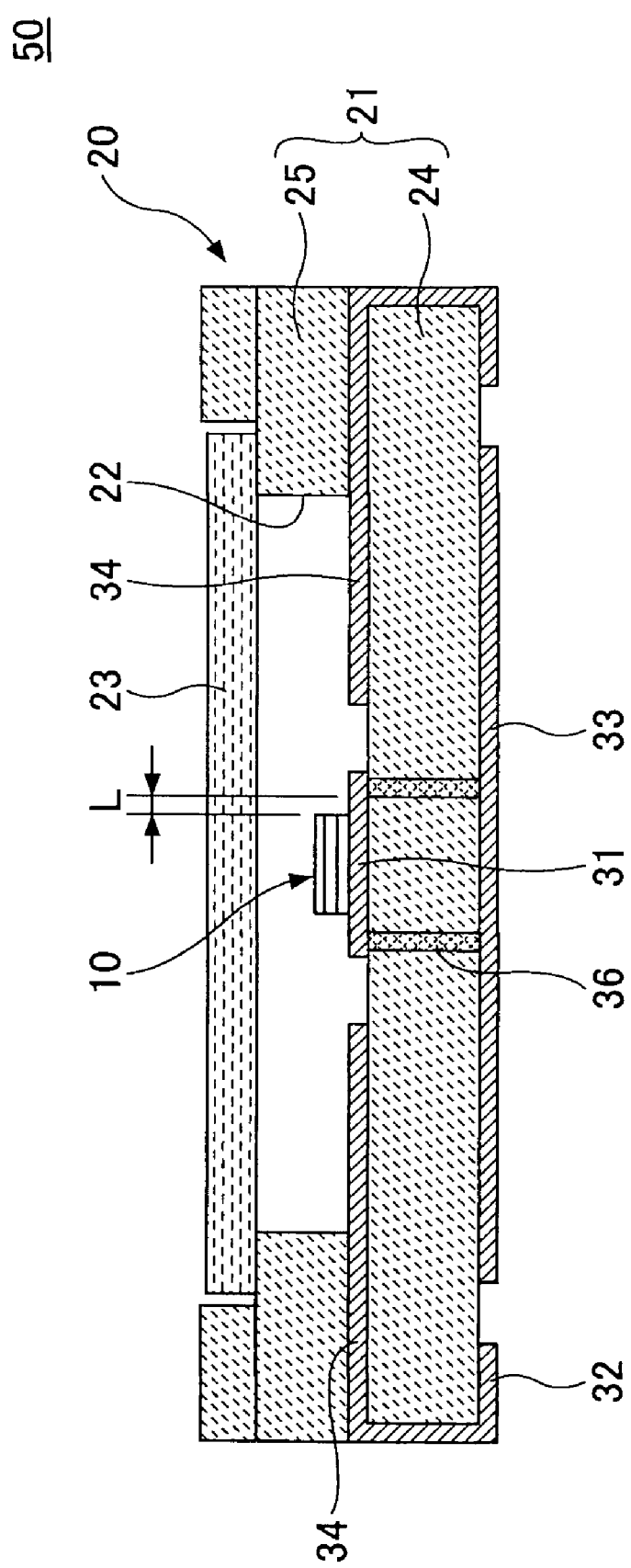
FIG. 5 is another cross section of the light emitting apparatus according to the first embodiment.
Figure 6:
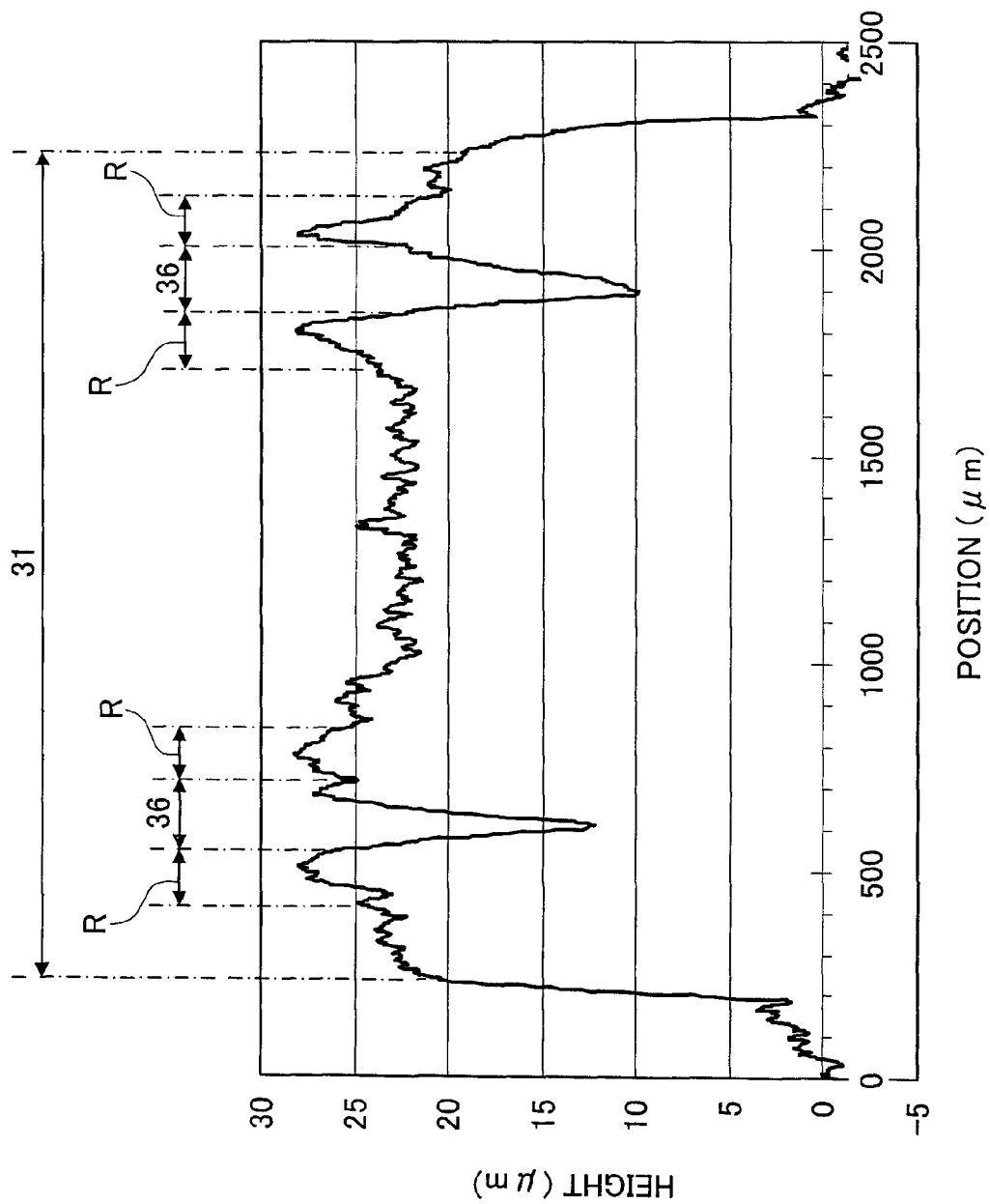
FIG. 6 shows a graph plotting changes in height around penetrating electrodes in the light emitting apparatus according to the first embodiment.

With reference to FIGS. 1, 5, and 6, a description is given of a mechanism of the light emitting apparatus according to the present embodiment for aligning the direction of emission of laser light to be parallel with the direction normal to the bottom surface in the opening portion of the ceramic package.

FIG. 5 shows a schematic cross section of the light emitting apparatus according to the present embodiment. FIG. 6 shows a graph plotting the height near the penetrating electrodes in the light emitting apparatus.

As shown in FIG. 6, there are raised portions R with heights of about 5 μm within 100 to 150 μm of each of the penetrating electrodes 36. These raised portions R are produced upon formation of the via hole by micro-drilling or punching with a mold following the manufacture of the green sheet, or when the via hole is filled with the conductive paste and the conductive paste is applied by printing.

If the surface emitting laser array 10 is mounted such that the back surface of the surface emitting laser array 10 partly rests on the raised portions R around the penetrating electrode 36, the back surface of the surface emitting laser array 10 would be inclined with respect to the bottom surface 26 of the opening portion. As a result, the light emitted from the surface emitting laser array 10 would be inclined with respect to the direction normal to the upper surface or back surface of the ceramic package 20. Therefore, the surface emitting laser array 10 needs to be installed so that no parts of the back surface of the surface emitting laser array 10 rest on the raised portions R around the penetrating electrode 36. Thus, in accordance with the present embodiment, the penetrating electrodes 36 are provided in such areas of the mount portion 31 above which the surface emitting laser array 10 is not mounted.

Further, in order to completely eliminate the influence of the raised portions R around the penetrating electrodes 36, it is not sufficient to just make sure that no parts of the back surface of the surface emitting laser array 10 rest on the raised portions R around the penetrating electrodes 36. As shown in FIG. 6, when the penetrating electrode 36 has a diameter of 0.2 mm, there are raised portions R with heights of about 5 μm in areas of 100 to 150 μm around the penetrating electrode 36. Therefore, the penetrating electrode 36 and the surface emitting laser array 10 are spaced apart by a distance L in plan view, as shown in FIG. 5. Specifically, the distance L may be 0.2 mm or greater.

In this case, the penetrating electrodes 36 may be arranged as shown in FIG. 1, where the rectangular surface emitting laser array 10 is mounted at the center of the mount portion 31 in plan view, surrounded by a total of eight penetrating electrodes 36. The eight penetrating electrodes 36 are the four located at the four corners of the surface emitting laser array 10, and the remaining four at the intermediate points of the adjacent ones of the electrodes at the corners.

When the surface emitting laser array 10 is dimensioned 1.2 mm square, and if a height difference of 5 μm is produced between the ends of one of the sides of the surface emitting laser array 10, an inclination of $\tan^{-1}(5/1200)=0.24°$ is produced, which poses a major cause of defect when the variations in emission angle need to be reduced within ±0.5°. On the other hand, when the surface emitting laser array 10 and the penetrating electrode 36 are spaced apart by 0.2 mm or greater in plan view, as shown in FIG. 6, the height difference between the ends of the side of the surface emitting laser array 10 can be reduced to within 1 μm, so that the inclination angle can be contained within $\tan^{-1}(1/1200)=0.05°$.

With reference to FIG. 7, an assembly of the light emitting apparatus 50 according to the present embodiment mounted on a printed board 40 is described. The effect of preventing the peeling of the soldered portion after the mounting on the printed board due to heat history is also described.

As shown in a schematic cross section in FIG. 7, the printed board 40 includes a printed board ("PB") substrate 41. On an upper surface of the PB substrate 41, there are formed a PB upper-surface electrode 42 and a PB upper-surface heat-dissipating electrode 43, which correspond to the back-surface electrode 32 and the back-surface heat-dissipating electrode 33, respectively, of the light emitting apparatus 50. On a lower surface of the PB substrate 41, there is formed a back-surface heat-dissipating electrode 44. Further, penetrating electrodes 45 are formed through the PB substrate 41 in order to thermally connect the PB upper-surface heat-dissipating electrode 43 and the PB back-surface heat-dissipating electrode 44.

The light emitting apparatus 50 is mounted on the printed board 40, with the back-surface electrodes 32 and the PB upper-surface electrode 42 being soldered using a solder 46. The back-surface heat-dissipating electrode 33 and the PB upper-surface heat-dissipating electrode 43 are also connected by the soldering 46. As a result, the individual electrodes 12 of the surface emitting laser array 10 are electrically connected with the PB upper-surface electrode 42 via the individual electrode leads 34 of the ceramic package 20 and the back-surface electrodes 32 on the back surface of the ceramic package 20.

The common electrode 13 of the surface emitting laser array 10 is electrically connected to a PB upper-surface electrode (not shown) connected to ground, via the mount portion 31 and the common electrode leads 35 of the ceramic package 20 and a back-surface electrode (not shown) on the back surface of the ceramic package 20 which is connected to ground.

The common electrode 13 of the surface emitting laser array 10 is also thermally connected to the PB upper-surface heat-dissipating electrode 43 via the mount portion 31, the penetrating electrodes 36, and the back-surface heat-dissipating electrode 33 of the ceramic package 20. Further, the common electrode 13 is thermally connected to the PB back-surface heat-dissipating electrode 44 via the PB penetrating electrodes 45.

The back-surface heat-dissipating electrode 33, which is formed substantially throughout the back surface of the ceramic package 20, is thermally connected to the PB upper-surface heat-dissipating electrode 43 by soldering. For example, solder paste is applied to the soldered electrode portions on the printed board 40, and the light emitting apparatus 50 is mounted on the printed board 40 such that the individual soldered electrode positions are aligned, followed by a reflow process.

The material of the PB substrate 41 is not particularly limited, and a general glass epoxy resin, such as FR-4, may be used.

When voltage application between the individual electrodes 12 and the common electrode 13 of the surface emitting laser array 10 is turned on and off, light emission starts and stops. Correspondingly, the surface emitting laser array 10 starts and stops generating heat, causing a repetition of temperature rise and fall, thus creating a thermal history. The coefficient of thermal expansion of the alumina ceramics in the ceramic package is 7 ppm/° C., while that of the glass epoxy resin in the PB substrate 41 is 14 to 16 ppm/° C. This large difference in the coefficient of thermal expansion produces a repeated stress applied to the solder portion 46 where the back-surface electrodes 32 of the ceramic package 20 and the PB upper-surface electrode 42 are joined. As a result, fatigue occurs in the soldered portion and may eventually destroy it.

In accordance with the present embodiment of the invention, the ceramic package 20 and the printed board 40 are connected by soldering not only between the back-surface electrodes 32 and 32a and the PB upper-surface electrode 42, but also between the back-surface heat-dissipating electrode 33 and the PB upper-surface heat-dissipating electrode 43. In this case, because the back-surface heat-dissipating electrode 33 is formed substantially throughout the back surface of the ceramic package 20, the junction area between the ceramic package 20 and the printed board 40 increases significantly.

For example, when the back surface of the ceramic package 20 is 14 mm square, each of the 48 back-surface electrodes 32 and 32a is 1 mm square, and the back-surface heat-dissipating electrode 33 is 10 mm square, the total area of the back-surface electrodes 32 and 32a alone is 48 mm². On the other hand, the total area of the 48 back-surface electrodes 32 and 32a and the area of the back-surface heat-dissipating electrode 33 is 148 mm², showing an increase in junction area of about three times.

Assuming that soldering strength per unit area does not change, the three times increase in junction area translates into a three times increase in junction strength as well. Because the stress produced by heat history does not change when the back-surface heat-dissipating electrode 33 is also soldered, the additional soldering between the back-surface heat-dissipating electrode 33 and the printed board 40 makes the assembly of the ceramic package 20 and the printed board 40 resistant to a greater number of repetitions in temperature rises and falls in heat history.

Thus, the light emitting apparatus according to the present embodiment exhibits improved heat-dissipating characteristics and is resistant to destruction due to the thermal expansion difference between the ceramic package 20 and the printed board 40, wherein inclination in light emitted direction is prevented.

While in accordance with the present embodiment the back-surface heat-dissipating electrode is formed substantially throughout the back surface of the ceramic package, the back-surface heat-dissipating electrode may be provided at a central portion of the ceramic package back surface as long as sufficient heat dissipation can be ensured.

First Variation of the First Embodiment

Hereafter, the light emitting apparatus according to a first variation of the first embodiment of the present invention is described with reference to FIGS. 8A through 9.

Figure 8A:
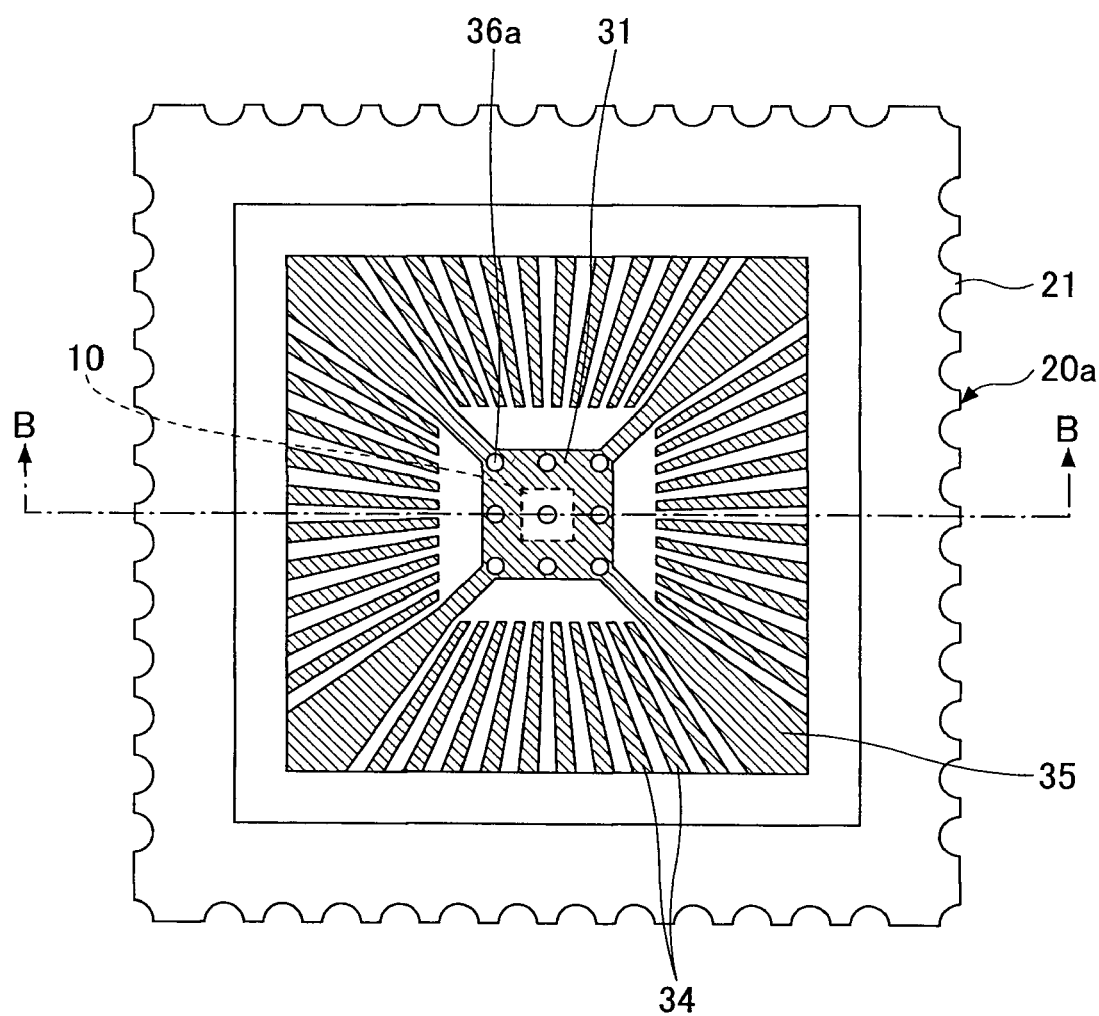
FIG. 8A shows an example of a first variation of the first embodiment.
Figure 8B:
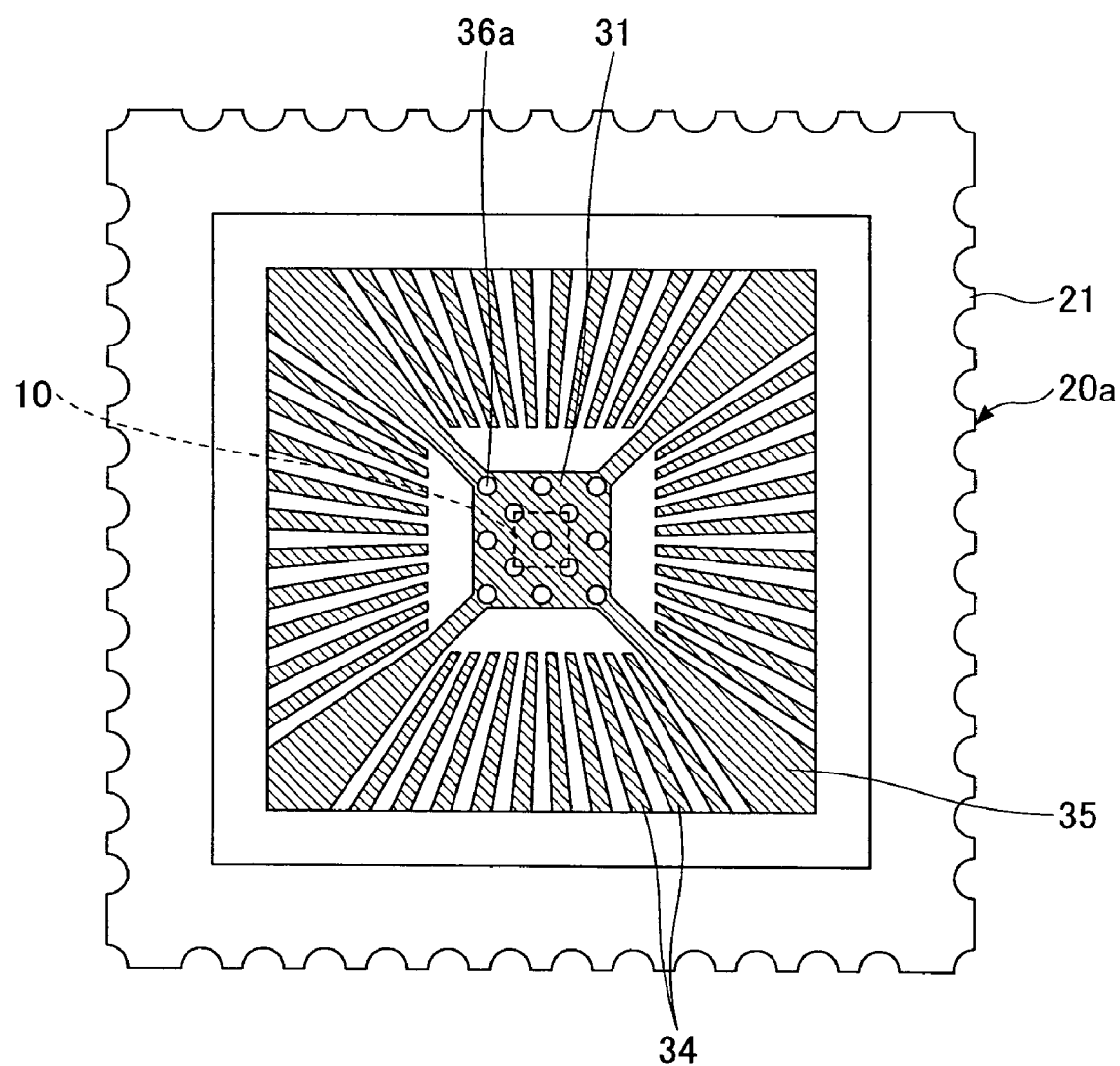
FIG. 8B shows another example of the first variation of the first embodiment.

FIGS. 8A and 8B are plan views showing the structure of the ceramic package of the light emitting apparatus according to the present variation, prior to the mounting of the surface emitting laser array. FIG. 9 is a cross section of the light emitting apparatus taken along line B-B of FIG. 8A.

The light emitting apparatus according to the present variation differs from the light emitting apparatus according to the first embodiment in that the penetrating electrodes may be provided below the surface emitting laser.

With reference to FIGS. 8A and 9, in the light emitting apparatus 50a according to the present variation, penetrating electrodes 36a may be provided in the mount portion 31 below where the surface emitting laser array 10 is mounted. For example, the total number of the penetrating electrodes 36a is nine as shown, which is one more than the eight according to the first embodiment. The diameter of each penetrating electrode 36a may be 0.2 mm as in the first embodiment.

By providing the penetrating electrode 36a immediately below the surface emitting laser array 10, a height difference of about 5 μm may be caused where the surface emitting laser array 10 is mounted. However, the penetrating electrode 36a immediately below the surface emitting laser array 10 increases the cross-sectional area of the heat-transfer path from the mount portion 31 to the back-surface heat-dissipating electrode 33, enabling better heat dissipation. Thus, degradation in characteristics or the decrease in lifetime of the surface emitting laser array 10 due to temperature rise can be prevented.

The number of the penetrating electrodes 36a may be further increased in order to improve heat-dissipating characteristics. For example, 13 penetrating electrodes 36a may be employed as shown in FIG. 8B.

Second Variation of the First Embodiment

Hereafter, the light emitting apparatus according to a second variation of the first embodiment of the present invention is described with reference to FIGS. 10 to 12.

Figure 10:
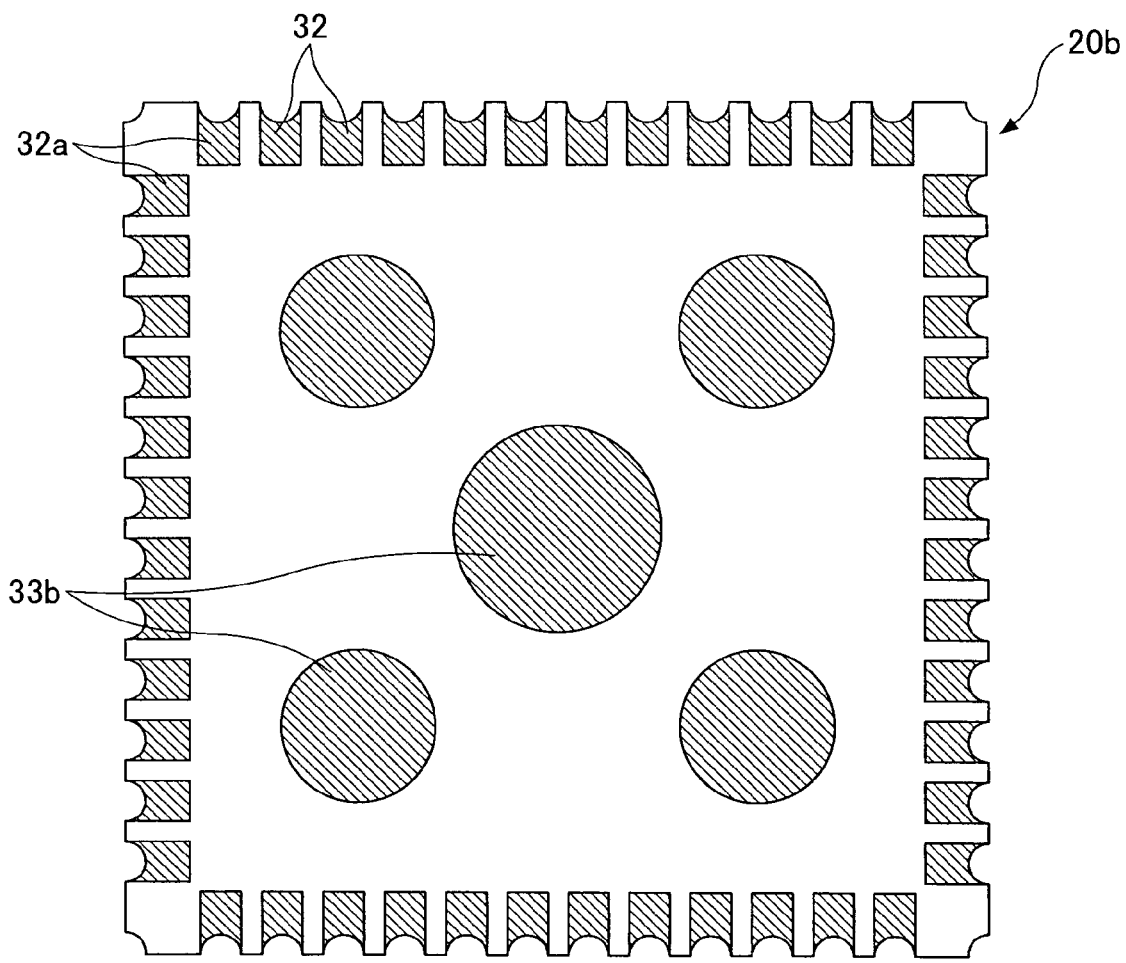
FIG. 10 schematically shows a back surface of the light emitting apparatus according to a second variation of the first embodiment.

FIG. 10 schematically shows the back surface of the light emitting apparatus according to the second variation. FIG. 11 shows a schematic cross section of the light emitting apparatus according to the second variation. FIG. 12 shows a schematic cross section of an assembly of the light emitting apparatus according to the second variation mounted on a printed board.

The light emitting apparatus according to the second variation differs from the first embodiment in that the back-surface heat-dissipating electrode is divided into five portions.

Figure 11:
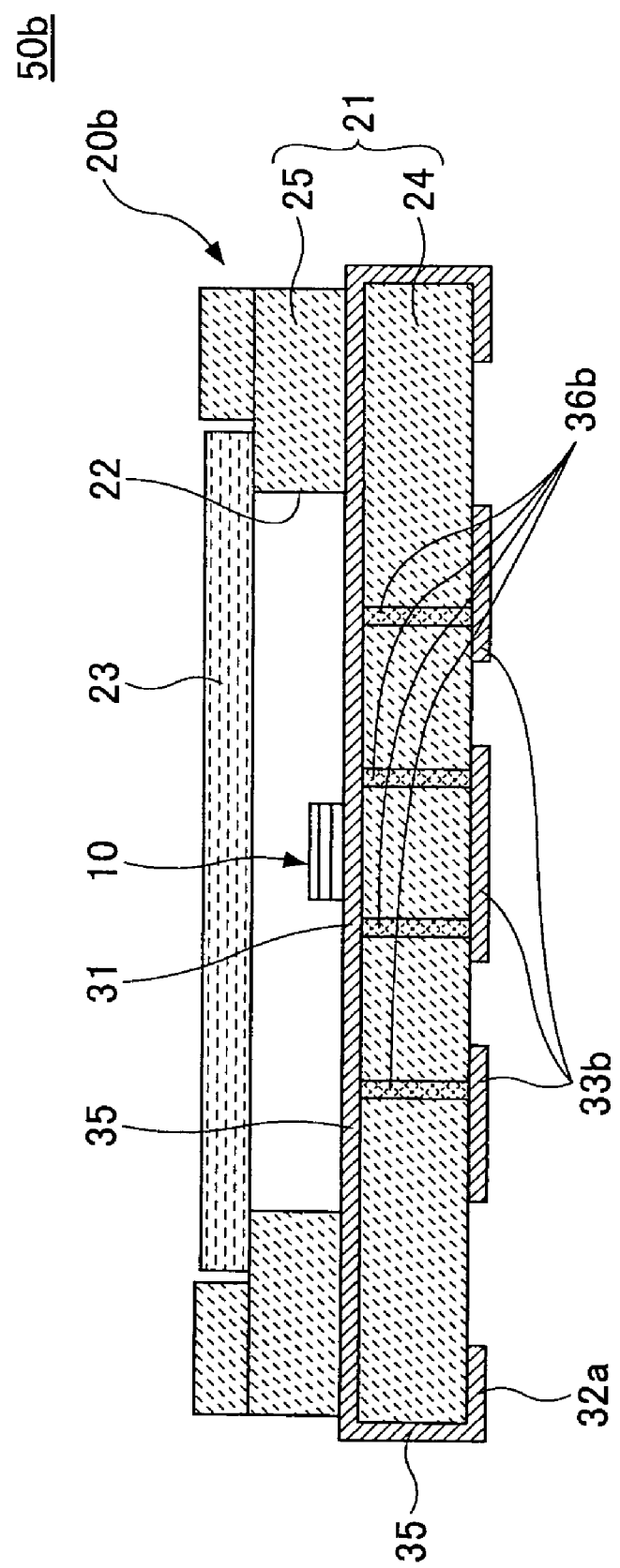
FIG. 11 is a cross section of the light emitting apparatus according to the second variation of the first embodiment.
Figure 12:
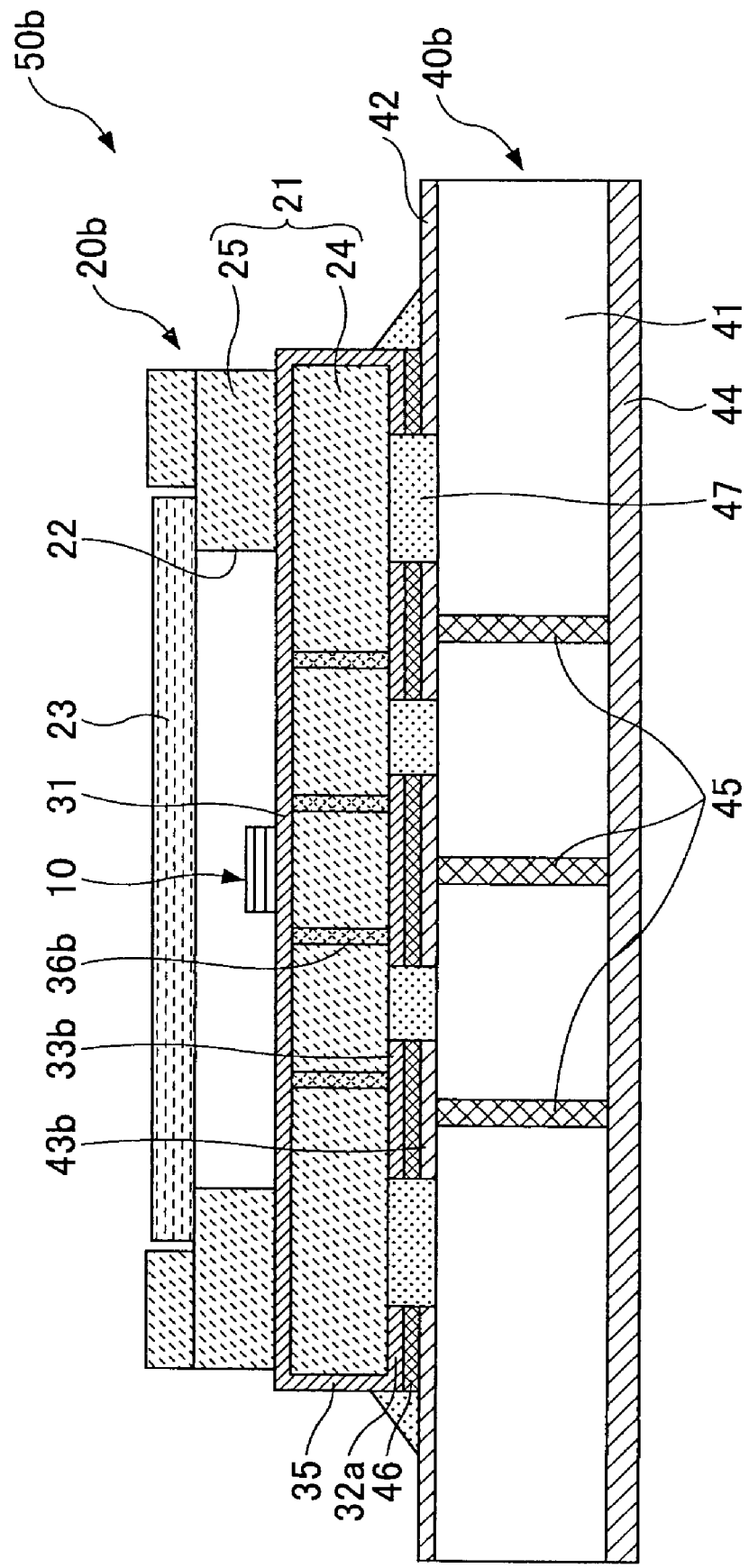
FIG. 12 is a cross section of an assembly of the light emitting apparatus according to the second variation of the first embodiment mounted on a printed board.

With reference to FIGS. 10 and 11, five separate back-surface heat-dissipating electrodes 33b are formed on the back surface of the ceramic package 20b. Each of the five back-surface heat-dissipating electrodes 33b is thermally connected with the mount portion 31 via the penetrating electrodes 36b. Thus, although the back-surface heat-dissipating electrodes are separate, the light emitting apparatus according to the second variation exhibits high heat-dissipating characteristics as in the first embodiment.

Hereafter, the assembly of the ceramic package 20b mounted on the printed board is described with reference to FIG. 12.

As shown, the ceramic package 20b is mounted on the printed board 40b by soldering via the solder 46 so that the five separate back-surface heat-dissipating electrodes 33b are thermally connected with PB (printed-board) upper-surface heat-dissipating electrodes 43b. The gaps between the plural back-surface heat-dissipating electrodes 33b and the PB upper-surface heat-dissipating electrodes 43b are filled with an underfill material 47. Thus, the entire back surface of the light emitting apparatus 50b is joined with the printed board 40b via the plural back-surface heat-dissipating electrodes 33b and the underfill material 47.

The joining of the entire back surface of the light emitting apparatus 50b with the printed board 40b provides improved thermal connection between the light emitting apparatus 50b and the printed board 40b. In addition, the joint prevents the destruction of the soldered portions by thermal expansion difference.

While in the second variation the back-surface heat-dissipating electrode consists of the five separate parts, the back-surface electrode may be divided in any number or shape as long as the parts have substantially two-fold symmetric or four-fold symmetric shapes so that heat dissipation can occur uniformly for the ceramic package as a whole.

Third Variation of the First Embodiment

Figure 13:
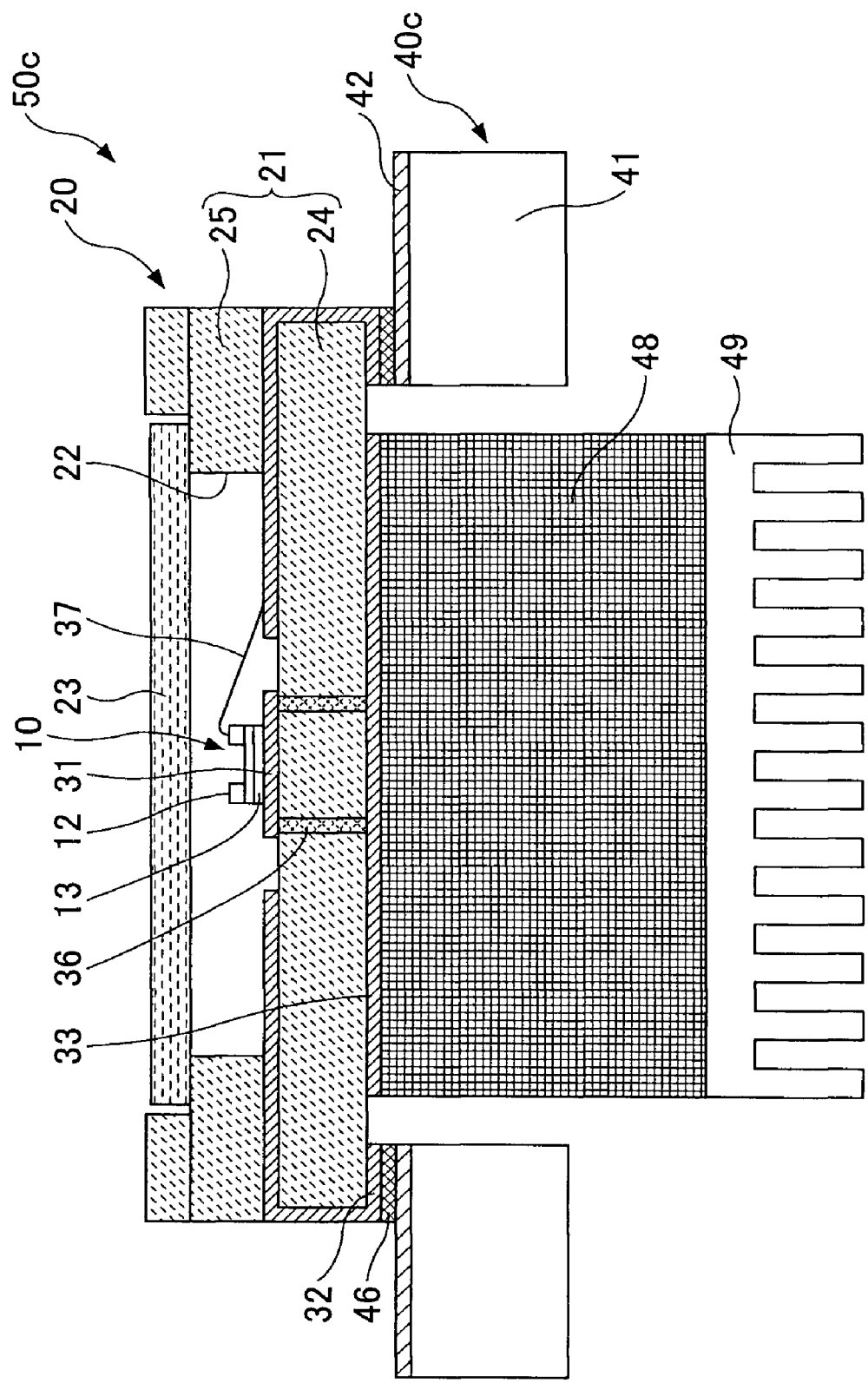
FIG. 13 is a cross section of the light emitting apparatus according to a third variation of the first embodiment.

Hereafter, reference is made to FIG. 13 to describe the light emitting apparatus according to a third variation of the first embodiment of the present invention.

FIG. 13 shows a schematic cross section of the light emitting apparatus according to the third variation, which differs from the first embodiment in that a heatsink is connected to the back-surface heat-dissipating electrode.

As shown in FIG. 13, in the light emitting apparatus 50c, a heatsink 48 is connected to the back-surface heat-dissipating electrode 33 instead of the printed board 40c as in the first embodiment.

As shown in FIG. 13, the heatsink 48 includes fins 49 for promoting the exchange of heat with the outside. Thus, the heat generated by the surface emitting laser array 10 and transmitted to the heatsink 48 via the common electrode 13, the mount portion 31, and the penetrating electrodes 36 can be efficiently dissipated to the outside.

In another embodiment, the heatsink 48 may be further provided with a cooling mechanism of the water-cooled type or air-cooled type (not shown) so that the heat from the light emitting apparatus can be dissipated to the outside even more efficiently.

Thus, in accordance with the light emitting apparatus of the present embodiment, the heatsink installed on the back-surface heat-dissipating electrode printed board provides an improved heat-dissipating effect.

Second Embodiment

Figure 14:
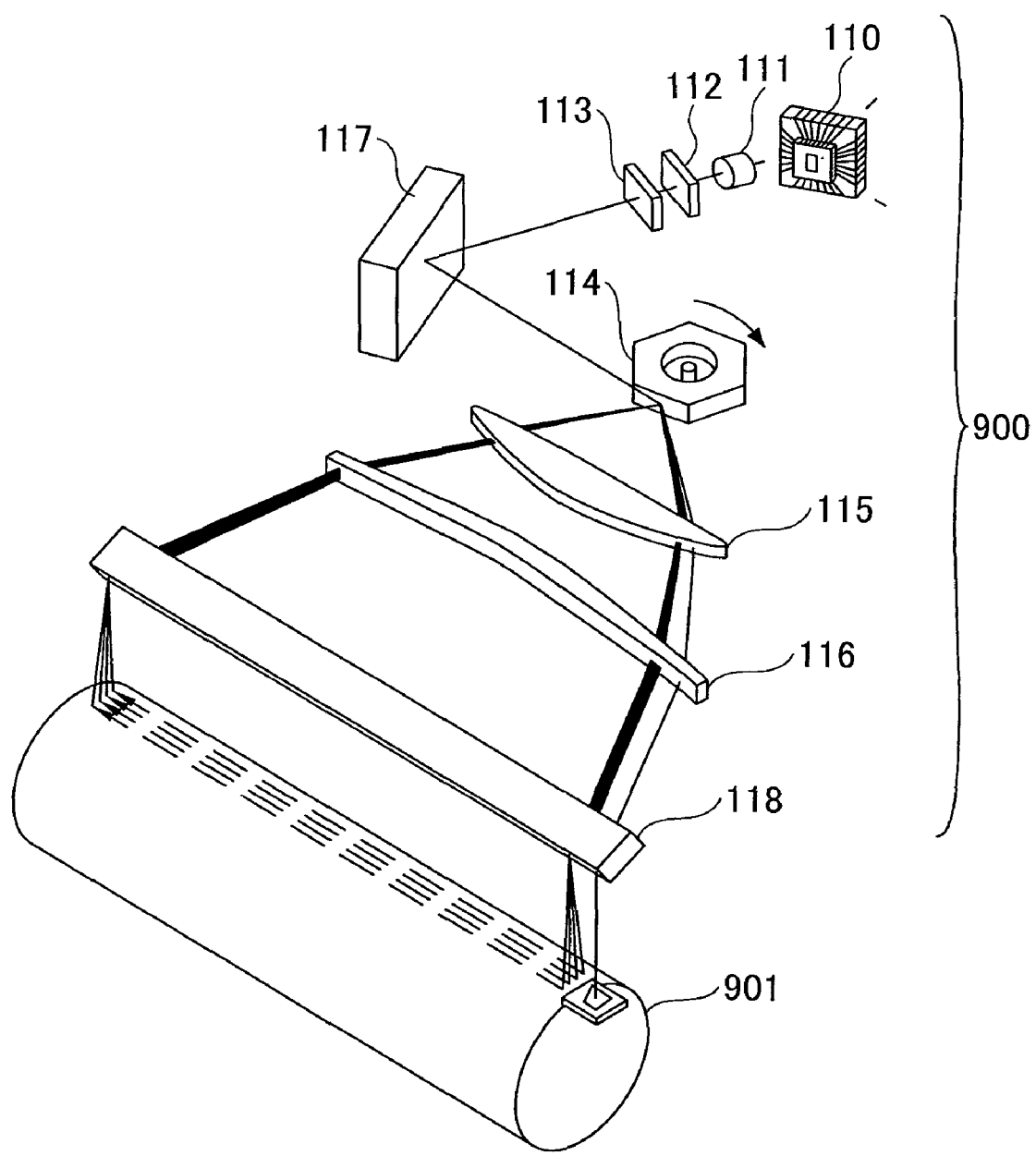
FIG. 14 is a cross section of the optical scanning apparatus according to a second embodiment of the present invention.
Figure 15:
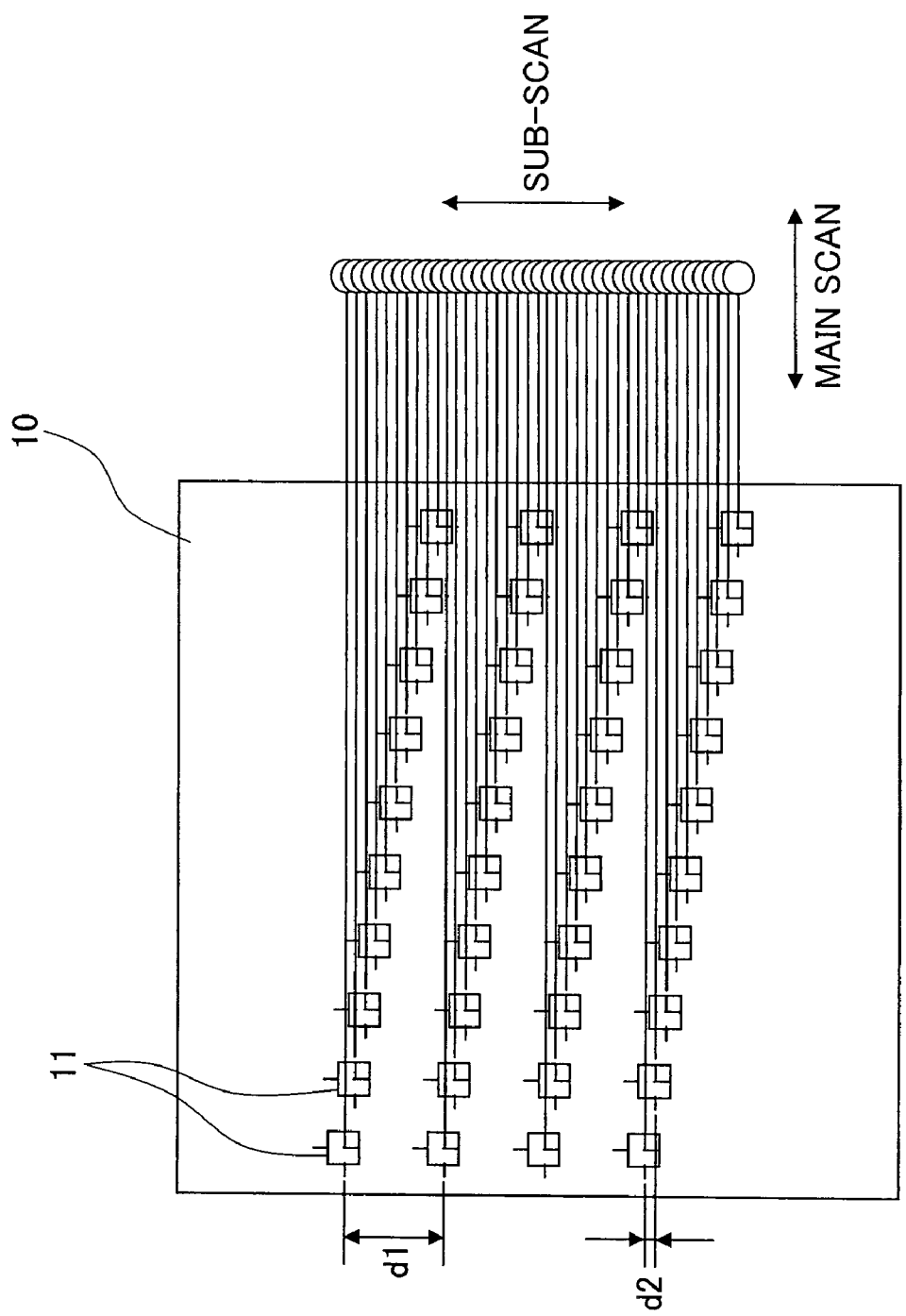
FIG. 15 shows a surface emitting laser array of the optical scanning apparatus according to the second embodiment on which surface emitting laser elements are disposed, illustrating the relationship between the surface emitting laser elements and the scanned directions.

With reference to FIGS. 14 and 15, an optical scanning apparatus according to the second embodiment of the present invention is described.

The optical scanning apparatus according to the present embodiment includes the light emitting apparatus according to any one of the first embodiment and the first through third variations of the first embodiment as a light source unit. The light emitted by the light emitting apparatus is collected by a deflector and a scanning optical system on a scanned surface.

FIG. 14 shows a schematic illustration of a structure of the optical scanning apparatus according to the second embodiment. FIG. 15 schematically illustrates the relationship between individual surface emitting laser elements formed on the surface emitting laser array and the directions in which the optical scanning apparatus scans.

With reference to FIG. 14, the optical scanning apparatus 900 includes a light source unit 110 including the surface emitting laser array 10; a coupling lens 111; an aperture 112; a cylindrical lens 113; a polygon mirror 114; an fθ lens 115; a toroidal lens 116; mirrors 117 and 118; and a main controller (not shown) for centrally controlling the aforementioned units.

An optical beam emitted by the light source unit 110 is modified into substantially parallel light by the coupling lens 111. The size of the optical beam that has passed through the coupling lens 111 is defined by the aperture 112, and the optical beam that has passed through the aperture 112 is collected on a reflecting surface of the polygon mirror 114 by the cylindrical lens 113 via the mirror 117.

The polygon mirror 114 is a hexagonal column with reduced height, having six deflecting surfaces formed on the sides. The polygon mirror 114 is rotated by a rotating mechanism (not shown) in a direction of the arrow in FIG. 14 at a constant angular velocity. Thus, the optical beam emitted by the light source unit 110 and then collected on the deflecting surfaces of the polygon mirror 114 by the cylindrical lens 113 is deflected at a constant angular velocity as the polygon mirror 114 rotates.

The fθ lens 115 has an image height proportional to the angle of incidence of the optical beam from the polygon mirror 114. Thus, the fθ lens 115 causes the image plane of the optical beam, as it is deflected by the polygon mirror 114 at the constant angular velocity, to move at a constant velocity with respect to the main scan direction. The toroidal lens 116 focuses the optical beam from the fθ lens 115 at the surface of a photosensitive drum 901 via the mirror 118.

In the optical scanning apparatus 900, when the surface emitting laser array 10 is arranged as shown in FIG. 15, the centers of the surface emitting laser elements 11 are disposed at equal intervals (d2) in the sub-scan direction. Thus, by adjusting the turn-on timing of the individual surface emitting laser elements 11, the same effect can be obtained as when light sources are arranged above the photosensitive drum 901 at equal intervals in the sub-scan direction.

For example, when the surface emitting laser elements 11 have a pitch d1 of 26.5 μm in the sub-scan direction, the interval d2 is 2.65 μm. When the optical system has a magnifying power of 2, written dots can be formed on the photosensitive drum 901 at 5.3 μm intervals in the sub-scan direction. This corresponds to a high-density writing of 4800 dpi (dots per inch). Printing at even higher resolutions can be performed by either increasing the number of the surface emitting laser elements 11 in the main scan direction, reducing the pitch d1 and the interval d2, or reducing the magnifying power of the optical system. The written intervals in the main scan direction can be easily controlled by controlling the timing of turning-on of the light source.

In this case, because the surface emitting laser elements 11 can generate a high single fundamental transverse-mode output even when the written-dot density increases, printing can be performed without decrease in print speed. In other words, the print speed can be further increased when the written-dot density is the same.

The optical scanning apparatus 900 according to the present embodiment includes the light emitting apparatus according to any one of the first embodiment and the first through third variations of the first embodiment. Thus, the temperature increase in the individual surface emitting laser elements 11 on the surface emitting laser array 10 is reduced, so that even when the pitch d1=26.5 μm and the interval d2=2.65 μm, each surface emitting laser element 11 can output a high-output optical beam. The long-term reliability (element life) of the optical scanning apparatus 900 can also be improved.

As described above, in accordance with the optical scanning apparatus 900 of the present embodiment, in which the light source unit 110 includes the surface emitting laser array 10, a high-resolution latent image can be formed on the surface of the photosensitive drum 901 at high speed.

Third Embodiment

Figure 16:
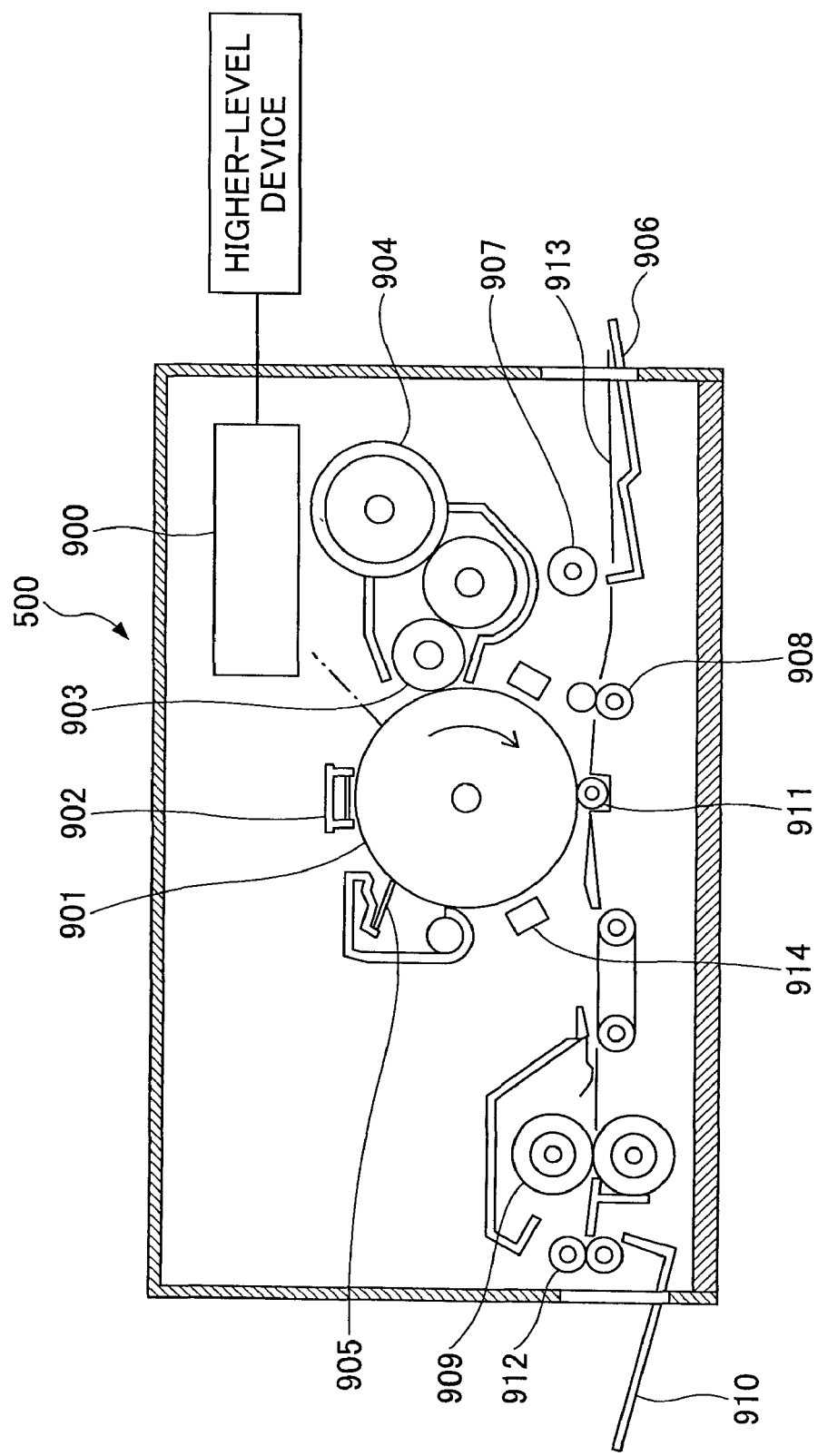
FIG. 16 schematically shows a laser printer as an image forming apparatus according to a third embodiment of the present invention.

With reference to FIG. 16, an image forming apparatus according to a third embodiment of the present invention is described.

The image forming apparatus according to the third embodiment of the present invention may comprise a laser printer 500 shown in FIG. 16. The laser printer 500 includes the optical scanning apparatus 900 according to the second embodiment, and at least one image carrier, such as a photosensitive drum, having a scanned surface optically scanned by the optical scanning apparatus.

With reference to FIG. 16, the laser printer 500 includes the optical scanning apparatus 900; the photosensitive drum 901; a charger 902; a developing roller 903; a toner cartridge 904; a cleaning blade 905; a sheet feed tray 906; a sheet-feeding roller 907; a resist roller pair 908; a transfer charger 911; a neutralizing unit 914; a fusing roller 909; an ejection roller 912; and an ejected sheet tray 910.

The charger 902, the developing roller 903, the transfer charger 911, the neutralizing unit 914, and the cleaning blade 905 are disposed near the surface of the photosensitive drum 901, in the following order in the rotating direction of the photosensitive drum 901: charger 902→developing roller 903→transfer charger 911→neutralizing unit 914→cleaning blade 905.

On the surface of the photosensitive drum 901, a photosensitive layer is formed. In the illustrated example shown in FIG. 16, the photosensitive drum 901 is rotated in clockwise direction (as indicated by the arrow). The charger 902 charges the surface of the photosensitive drum 901 uniformly.

The charged surface of the photosensitive drum 901 is then irradiated with the light from the optical scanning apparatus 900, the light being modulated based on image information from a higher-level device (such as a personal computer). As a result, a latent image corresponding to the image information is formed on the surface of the photosensitive drum 901. The latent image is then transported to the developing roller 903 as the photosensitive drum 901 rotates.

The toner cartridge 904 stores toner that is supplied to the developing roller 903. The developing roller 903 causes the toner to attach to the latent image on the photosensitive drum 901, whereby the image information is developed. The developed image is then transported to the transfer charger 911 as the photosensitive drum 901 rotates.

The sheet feed tray 906 contains sheets of recording paper 913. The recording paper 913 is picked out of the sheet feed tray 906 by the sheet-feeding roller 907 disposed near the sheet feed tray 906, one sheet at a time. The recording paper 913 picked out by the sheet-feeding roller 907 is then sent into the gap between the photosensitive drum 901 and the transfer charger 911 in step with the rotation of the photosensitive drum 901, while being retained by the resist roller pair 908 disposed near the transfer charger 911.

The transfer charger 911 is supplied with a voltage of the opposite polarity from the toner so that the toner on the surface of the photosensitive drum 901 can be electrically drawn toward the recording paper 913. The voltage thus causes the developed image on the photosensitive drum surface to be transferred to the recording paper 913. The recording paper 913 with the transferred image thereon is sent to the fusing roller 909.

The fusing roller 909 applies heat and pressure to the recording paper 913 to thereby fuse the toner on the recording paper 913. The recording paper 913 with the fused toner thereon is finally ejected onto and stacked in the ejected sheet tray 910 via the ejection roller 912.

The surface of the photosensitive drum 901 is neutralized by the neutralizing unit 914. Remaining toner on the surface of the photosensitive drum 901 (residual toner) is removed by the cleaning blade 905. The removed residual toner may be recycled. The surface of the photosensitive drum 901 from which the residual toner has been removed then returns to the position of the charger 902.

In accordance with the present embodiment, the laser printer 500 includes the optical scanning apparatus 900 according to the second embodiment. The light source unit 110 of the optical scanning apparatus 900 includes the light emitting apparatus 50 according to the first embodiment. Thus, the light source unit 110 enables the formation of a high-resolution latent image on the surface of the photosensitive drum 901 at high speed.

Preferably, the light source unit 110 may include the light emitting apparatus according to any one of the first through third variations of the first embodiment. In this case too, a high-resolution latent image can be formed on the surface of the photosensitive drum 901 at high speed.

The foregoing embodiment employs the single photosensitive drum 901 so that the image forming apparatus can only form a black and white image using a black toner, for example. However, the image forming apparatus according to another embodiment may be configured to form a color image. For example, the image forming apparatus may comprise a tandem color laser printer including an optical scanning apparatus adapted for color images, where there are provided plural photosensitive drums for the colors of black (K), cyan (C), magenta (M), and yellow (Y).

Although this invention has been described in detail with reference to certain embodiments, variations and modifications exist within the scope and spirit of the invention as described and defined in the following claims.

The present application is based on the Japanese Priority Applications No. 2008-141603 filed May 29, 2008 and No. 2009-097118 filed Apr. 13, 2009, the entire contents of which are hereby incorporated by reference.

What is claimed is:

1. A light emitting apparatus comprising:
   a surface emitting laser having plural individual electrodes disposed on an upper surface thereof and a common electrode disposed on a lower surface thereof; and
   a ceramic package having an opening portion and a metal mount portion disposed on a bottom surface of the opening portion for mounting the surface emitting laser,
   wherein the common electrode of the surface emitting laser is electrically connected with the mount portion,
   the ceramic package including a first back-surface electrode disposed at an edge on a back surface of the ceramic package, and a back-surface heat-dissipating electrode disposed at a center portion of the back surface of the ceramic package,
   wherein the mount portion, to which the common electrode is electrically connected, is electrically connected to a second back-surface electrode disposed at the edge on the back surface of the ceramic package via a common electrode lead, the second back-surface electrode being connected to ground,
   wherein the mount portion is also thermally connected to the back-surface heat-dissipating electrode via a penetrating electrode that penetrates the ceramic package between the bottom surface of the opening portion and the back surface of the ceramic package,
   wherein a plurality of the penetrating electrodes are provided below an area of the mount portion where the surface emitting laser is not mounted, and
   wherein each of the penetrating electrodes is spaced apart from the surface emitting laser by 0.2 mm or more in plan view.

2. The light emitting apparatus according to claim 1, wherein the common electrode lead is drawn out from the bottom surface of the opening portion onto a side of the ceramic package, from which the common electrode lead further extends around a lower edge of the side and reaches the back surface of the ceramic package.

3. The light emitting apparatus according to claim 1, wherein the hack-surface heat-dissipating electrode is formed substantially throughout the hack surface of the ceramic package.

4. The light emitting apparatus according to claim 1, wherein the back-surface heat-dissipating electrode includes plural back-surface heat-dissipating electrode portions, each of which being thermally connected to the mount portion via the penetrating electrode.

5. The light emitting apparatus according to claim 4, wherein the ceramic package is soldered to a printed board, wherein gaps between the plural back-surface heat-dissipating electrode portions and the first and second back-surface electrodes at the edge of the back surface of the ceramic package are filled with an underfill material.

6. The light emitting apparatus according to claim 1, wherein a heatsink is attached to the back-surface heat-dissipating electrode.

7. An optical scanning apparatus o scanning a scanned surface with light, comprising:
   the light emitting apparatus according to claim 1;
   a deflector configured to deflect light emitted by the emitting apparatus; and
   a scanning optical system configured to collect the light deflected by the deflector on the scanned surface.

8. An image forming apparatus comprising:

the optical scanning apparatus according to claim 7; and an image carrier having a scanned surface, wherein the optical scanning apparatus scans the scanned surface of the image carrier with light having information about an image in order to form the image on the scanned surface of the image carrier.

9. A light emitting apparatus comprising:

a surface emitting laser having plural individual electrodes disposed on an upper surface thereof and a common electrode disposed on a lower surface thereof; and a ceramic package having an opening portion and a metal mount portion disposed on a bottom surface of the opening portion for mounting the surface emitting laser, wherein the common electrode of the surface emitting laser is electrically connected with the mount portion, the ceramic package including a first back-surface electrode disposed at an edge on a back surface of the ceramic package, and a back-surface heat-dissipating electrode disposed at a center portion of the hack surface of the ceramic package, wherein the mount portion, to which the common electrode is electrically connected, is electrically connected to a second back-surface electrode disposed at the edge on the back surface of the ceramic package via a common electrode lead, the second back-surface electrode being connected to ground, wherein the mount portion is also thermally connected to the back-surface heat-dissipating electrode via a penetrating electrode that penetrates the ceramic package between the bottom surface of the opening portion and the back surface of the ceramic package, wherein the penetrating electrode is provided below an area of the mount portion where the surface emitting laser is not mounted, and wherein raised portions are disposed around the penetrating electrode, and no part of the surface emitting laser rests on the raised portions around the penetrating electrode, and wherein the penetrating electrode have a diameter of approximately 0.2 mm, and the raised portions around the penetrating electrode have a height that is approximately 5~m above the mount portion.

10. A light emitting apparatus comprising:

a surface emitting laser having plural individual electrodes disposed on an upper surface thereof and a common electrode disposed on a lower surface thereof; and a ceramic package having an opening portion and a metal mount portion disposed on a bottom surface of the opening portion for mounting the surface emitting laser, wherein the common electrode of the surface emitting laser is electrically connected with the mount portion, the ceramic package including a first back-surface electrode disposed at an edge on a back surface of the ceramic package, and a back-surface heat-dissipating electrode disposed at a center portion of the back surface of the ceramic package, wherein the mount portion, to which the common electrode is electrically connected, is electrically connected to a second back-surface electrode disposed at the edge on the back surface of the ceramic package via a common electrode lead, the second back-surface electrode being connected to ground, wherein the mount portion is also thermally connected to the back-surface heat-dissipating electrode via a penetrating electrode that penetrates the ceramic package between the bottom surface of the opening portion and the back surface of the ceramic package, wherein the penetrating electrode is provided below an area of the mount portion where the surface emitting laser is not mounted, and wherein the penetrating electrode is spaced apart from the surface-emitting laser array such that an inclination angle of a back surface of the surface emitting laser with respect to the bottom surface of the opening portion is no more than 0.05°.

\* \* \* \* \*